United States Patent
Hatcher et al.

(10) Patent No.: US 9,741,811 B2
(45) Date of Patent: Aug. 22, 2017

(54) INTEGRATED CIRCUIT DEVICES INCLUDING SOURCE/DRAIN EXTENSION REGIONS AND METHODS OF FORMING THE SAME

(71) Applicant: Samsung Electronics Co., Ltd., Suwon-si, Gyeonggi-do (KR)

(72) Inventors: Ryan M. Hatcher, Austin, TX (US); Borna J. Obradovic, Leander, TX (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/961,005

(22) Filed: Dec. 7, 2015

(65) Prior Publication Data

US 2016/0172358 A1 Jun. 16, 2016

Related U.S. Application Data

(60) Provisional application No. 62/092,179, filed on Dec. 15, 2014.

(51) Int. Cl.
*H01L 27/088* (2006.01)
*H01L 29/423* (2006.01)
(Continued)

(52) U.S. Cl.
CPC .... *H01L 29/42392* (2013.01); *H01L 27/0886* (2013.01); *H01L 29/775* (2013.01); *H01L 29/7833* (2013.01); *H01L 29/78696* (2013.01)

(58) Field of Classification Search
None
See application file for complete search history.

(56) References Cited

U.S. PATENT DOCUMENTS 4,839,702 A 6/1989 Grinberg et al.
5,081,511 A 1/1992 Tehrani et al.
(Continued)

FOREIGN PATENT DOCUMENTS

| DE | 3 629 680 A1 | 3/1988 | |
|---|---|---|---|
| JP | 2012141525 A | * 6/2012 | ............... G06F 9/30 |
| KR | 10-2010-0019212 A | 2/2010 | |

OTHER PUBLICATIONS

Machine-Translation of Omoto, Keisuke, "Display Device and Electronic Apparatus", JPO Patent Publication No. JP-2012141525-A, Jun. 26, 2012, translation obtained from J-PLATPAT (Japan Platform for Patent Information), available on website https://www4.j-platpat.inpit.go.jp/eng/tokujitsu/tkbs_en/TKBS_EN_GM101_Top.action.*

(Continued)

*Primary Examiner* — Johannes P Mondt
(74) *Attorney, Agent, or Firm* — Myers Bigel, P.A.

(57) ABSTRACT

Integrated circuit devices may include a stack that includes channel regions and gate electrodes stacked in an alternating sequence in a vertical direction. The channel regions may include impurities having a first conductivity type. The integrated circuit devices may also include source/drain regions on respective opposing sides of the stack, and the source/drain regions may be spaced apart from each other in a horizontal direction and may include impurities having a second conductivity type that is different from the first conductivity type. The integrated circuit devices may further include extension regions that may be between respective ones of channel regions and one of the source/drain regions and may include impurities having the second conductivity type. Each of the extension regions may have a thickness in the vertical direction that is less than those of the channel regions and the one of the source/drain regions.

10 Claims, 45 Drawing Sheets

(51) Int. Cl.
*H01L 29/786* (2006.01)
*H01L 29/78* (2006.01)
*H01L 29/775* (2006.01)

(56) References Cited

U.S. PATENT DOCUMENTS

| | | | |
|---|---|---|---|
| 5,086,282 A | 2/1992 | Aina et al. | |
| 5,119,151 A | 6/1992 | Onda | |
| 5,192,698 A | 3/1993 | Schuermeyer et al. | |
| 5,821,576 A | 10/1998 | Sriram | |
| 6,005,266 A | 12/1999 | Forrest et al. | |
| 6,326,650 B1 | 12/2001 | Allam | |
| 6,423,583 B1 | 7/2002 | Avouris et al. | |
| 6,995,078 B2 | 2/2006 | Liu et al. | |
| 7,060,539 B2 | 6/2006 | Chidambarrao et al. | |
| 7,166,522 B2 | 1/2007 | Liu et al. | |
| 7,221,006 B2 | 5/2007 | Orlowski et al. | |
| 7,332,386 B2 | 2/2008 | Lee et al. | |
| 7,402,844 B2 | 7/2008 | Sriram | |
| 7,452,778 B2 | 11/2008 | Chen et al. | |
| 7,525,136 B2 | 4/2009 | Saha et al. | |
| 7,531,423 B2 | 5/2009 | Cheng et al. | |
| 7,642,578 B2 | 1/2010 | Lee et al. | |
| 7,749,842 B2 | 7/2010 | Zhu et al. | |
| 7,755,115 B2 | 7/2010 | Awano | |
| 7,767,560 B2 | 8/2010 | Jin et al. | |
| 7,838,368 B2 | 11/2010 | Surdeanu et al. | |
| 7,902,541 B2 | 3/2011 | Sekaric et al. | |
| 7,939,861 B2 | 5/2011 | Horch | |
| 8,048,723 B2 | 11/2011 | Chang et al. | |
| 8,053,299 B2 | 11/2011 | Xu | |
| 8,114,746 B2 | 2/2012 | Wei et al. | |
| 8,129,763 B2 | 3/2012 | Bjoerk et al. | |
| 8,253,168 B2 | 8/2012 | Miller et al. | |
| 8,264,032 B2 | 9/2012 | Yeh et al. | |
| 8,299,499 B2 | 10/2012 | Aoike et al. | |
| 8,450,813 B2 | 5/2013 | Luo et al. | |
| 8,455,858 B2 | 6/2013 | Wang et al. | |
| 8,643,122 B2 | 2/2014 | Alptekin | |
| 8,674,341 B2 | 3/2014 | Ko et al. | |
| 9,178,045 B2 | 11/2015 | Obradovic et al. | |
| 2005/0164462 A1* | 7/2005 | Kim | H01L 21/26586 438/307 |
| 2006/0081836 A1 | 4/2006 | Kimura et al. | |
| 2006/0216897 A1 | 9/2006 | Lee et al. | |
| 2007/0018192 A1 | 1/2007 | Salzman et al. | |
| 2007/0200142 A1 | 8/2007 | Lee et al. | |
| 2008/0272402 A1 | 11/2008 | Saha et al. | |
| 2009/0170269 A1 | 7/2009 | Dutta | |
| 2011/0012125 A1* | 1/2011 | Nicholas | H01L 29/78609 257/72 |
| 2011/0147711 A1 | 6/2011 | Pillarisetty et al. | |
| 2012/0256248 A1 | 10/2012 | Bajaj et al. | |
| 2012/0273795 A1 | 11/2012 | Li | |
| 2013/0001591 A1 | 1/2013 | Wu et al. | |
| 2013/0200454 A1 | 8/2013 | Anderson et al. | |
| 2013/0285019 A1 | 10/2013 | Kim et al. | |
| 2013/0334500 A1 | 12/2013 | Smets et al. | |
| 2014/0084385 A1* | 3/2014 | Hoffmann | H01L 29/7833 257/402 |
| 2014/0131782 A1 | 5/2014 | Freeman et al. | |
| 2014/0151686 A1* | 6/2014 | Yamazaki | H01L 29/66969 257/43 |
| 2014/0252371 A1 | 9/2014 | Kwak et al. | |
| 2014/0367743 A1 | 12/2014 | Inoue et al. | |

OTHER PUBLICATIONS

Huang CY et al. "Influence of InP Source/Drain Layers upon the DC characteristics of InAs/InGaAs MOSFETs", *72$^{nd}$ Annual Device Research Conference (DRC)*, p. 225-226 (2014).

Huang CY et al. "Leakage Current Suppression in InGaAs-Channel MOSFETs: Received InP Source/Drain Spacers and InP Channel Caps", *IEEE Lester Eastman Conference on High Performance Devices (LEC)*, S5-H6, p. 1-4 (2014).

Lee S et al. "High performance raised source/drain InAs/InGaAs channel metal-oxide-semiconductor field-effect-transistors with reduced leakage using a vertical spacer", *Applied Physics Letters*, 103, p. 233503 (2013).

Lee S et al. "Record Ion (0.5 mA/um at Vdd=0.5V and Ioff=100nA/um) 25nm-Gate-Length ZrO2/InAs/InAlAs MOSFETs", *VLSI*, p. 978 (2014).

Luisier et al. "Investigation of InxGa1-xAs ultra-thin-body tunneling FETs using a full-band and atomistic approach", 2009 International Conference on Simulation of Semiconductor Processes and Devices (SISPAD 2009), Sep. 9-11, 2009, San Diego, CA, USA, 4 pages.

Miyoshi et al. "Analysis of geometrical structure and transport property in InAs.Si heterojunction nanowire tunneling field effect transistors", 2011 International Conference on Simulation of Semiconductor Processes and Devices (SISPAD 2011), Sep. 8-10, 2011, Osaka, Japan, pp. 227-230.

Nidhi et al. "Will Strong Quantum Confinement Effect Limit Low $V_{cc}$ Logic Application of III-V FINFETs?", Device Research Conference, 2012, 2 pages.

Peng et al. "Molecular beam epitaxy growth and characterization of lattice matched and strained channel InxGa1-xAs/InyAl1-yAs modulation doped structures on InP", Proceedings of the SPIE—The International Society for Optical Engineering, vol. 796, pp. 44-48, 1987.

Radhakrishnan et al. "InP/InxGa1-xAs (0.53<x<0.81)high electron mobility transistor structures grown by solid source molecular beam epitaxy", *Journal of Crystal Growth*, vol. 207, Issues 1-2, Nov. 1999, pp. 8-14.

\* cited by examiner

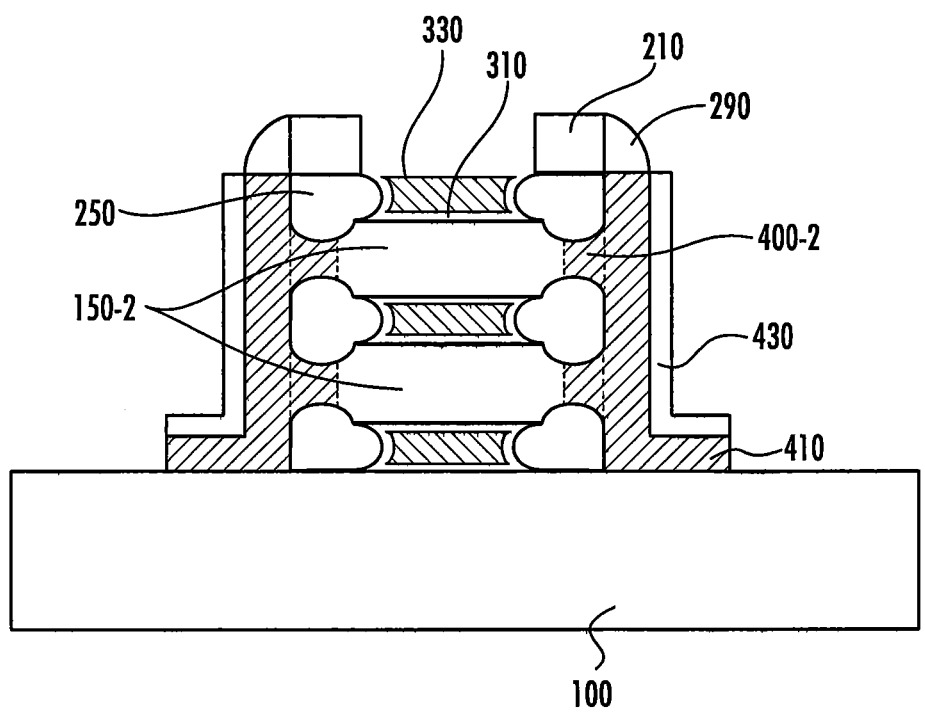
FIG. 3
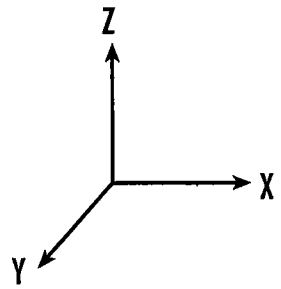

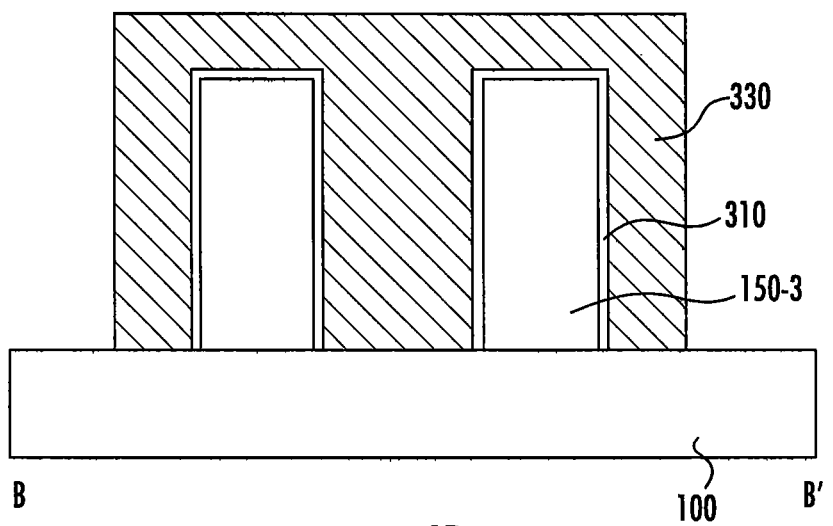
FIG. 4B
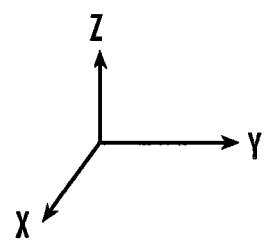

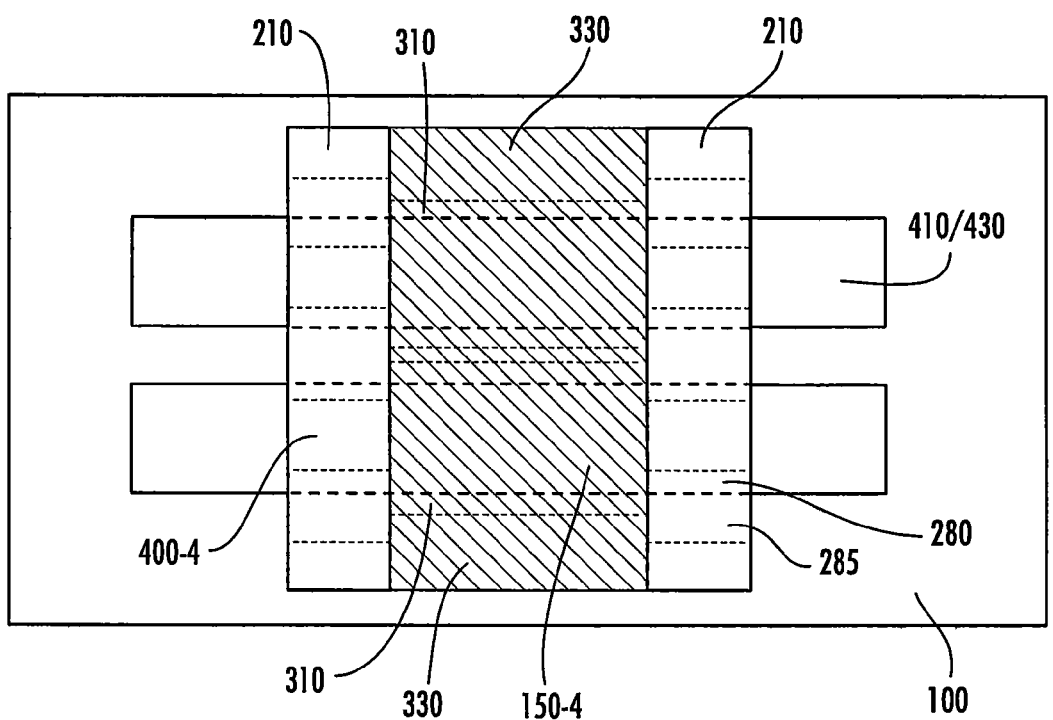
FIG. 5
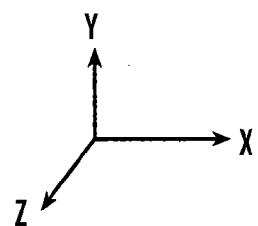

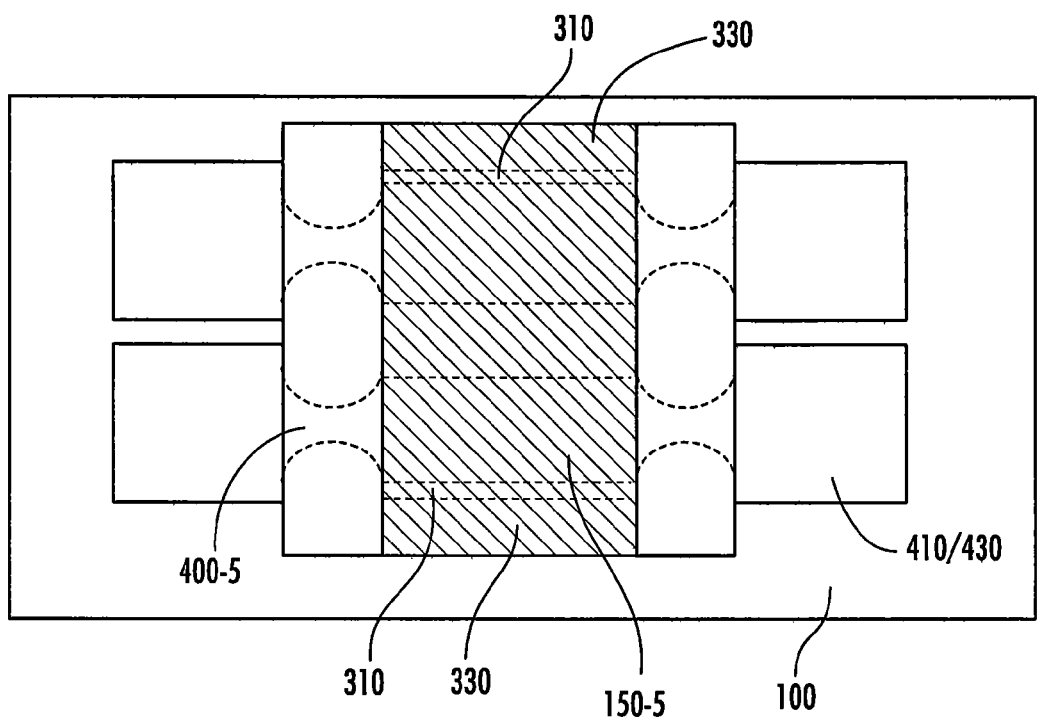
FIG. 6
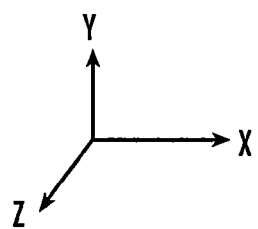

INTEGRATED CIRCUIT DEVICES INCLUDING SOURCE/DRAIN EXTENSION REGIONS AND METHODS OF FORMING THE SAME

CROSS-REFERENCE TO RELATED APPLICATION

This application claims priority of U.S. Provisional Application Ser. No. 62/092,179, entitled HIGH PERFORMANCE FINFET AND NANOSHEET DEVICES WITH LOW BAND TO BAND TUNNELING, filed in the USPTO on Dec. 15, 2014, the disclosure of which is hereby incorporated by reference in its entirety.

FIELD

The present disclosure generally relates to the field of electronics and, more particularly, to methods of forming integrated circuit devices.

BACKGROUND

Field-Effect Transistors (FETs) including high mobility channel materials have been developed to increase carrier mobility. However, those high mobility channel materials may cause higher leakage currents due to a larger band-to-band tunneling (BTBT) current in a drain region.

SUMMARY

An integrated circuit device may include a stack on a substrate. The stack may include a plurality of channel regions and a plurality of gate electrodes stacked in an alternating sequence in a vertical direction that is perpendicular to a surface of the substrate, and the plurality of channel regions may include impurities having a first conductivity type. The integrated circuit device may also include source/drain regions on respective opposing sides of the stack. The source/drain regions may be spaced apart from each other in a horizontal direction that is parallel to the surface of the substrate and may include impurities having a second conductivity type that is different from the first conductivity type. The integrated circuit device may further include a plurality of extension regions that may be between respective ones of the plurality of channel regions and one of the source/drain regions and may include impurities having the second conductivity type. Each of the plurality of extension regions may have a thickness in the vertical direction that is less than those of the plurality of channel regions and the one of the source/drain regions.

In various embodiments, a width of the plurality of gate electrodes in the horizontal direction may be less than a width of the plurality of channel regions in the horizontal direction.

According to various embodiments, each of the plurality of channel regions may overlap with the plurality of gate electrodes in plan view, and the thickness of the plurality of channel regions in the vertical direction may be uniform.

According to various embodiments, the thickness of each of the plurality of extension regions may decrease in the horizontal direction toward the one of the source/drain regions.

According to various embodiments, the thickness of each of the plurality of extension regions may decrease and then increase in the horizontal direction toward the one of the source/drain regions.

In various embodiments, the plurality of gate electrodes may be spaced apart from the one of the source/drain regions, and the device may further include a plurality of insulation layers between respective ones of the plurality of gate electrodes and the one of the source/drain regions. The plurality of insulation layers may have a dielectric constant lower than silicon oxide.

In various embodiments, an impurity concentration of the source/drain regions may be greater than an impurity concentration of the plurality of extension regions.

According to various embodiments, the source/drain regions and the plurality of extension regions may include a same material and composition.

An integrated circuit device may include a channel region extending from a substrate in a vertical direction that is perpendicular to a surface of the substrate. The channel region may include impurities having a first conductivity type and opposing sides spaced apart from each other in a first horizontal direction that is parallel to the surface of the substrate. The integrated circuit device may also include a gate electrode on the channel region and source/drain regions on the respective opposing sides of the channel region. The source/drain regions may include impurities having a second conductivity type that is different from the first conductivity type. The integrated circuit device may further include an extension region between the channel region and one of the source/drain regions. The extension region may include impurities having the second conductivity type and may have a width in a second horizontal direction that is perpendicular to the first horizontal direction less than those of the channel region and the one of the source/drain regions.

In various embodiments, a width of the gate electrode in the first horizontal direction may be less than a width of the channel region in the first horizontal direction.

According to various embodiments, the channel region may overlap with the gate electrode in plan view, and the width of the channel region in the second horizontal direction may be uniform.

In various embodiments, the width of the extension region in the second horizontal direction may be uniform.

In various embodiments, the width of the extension region in the second horizontal direction may decrease and then increase in the first horizontal direction toward the one of the source/drain regions.

According to various embodiments, the extension region may have a recessed upper surface when viewed in a cross section that is perpendicular to the second horizontal direction.

In various embodiments, an impurity concentration of the source/drain regions may be greater than an impurity concentration of the extension region.

In various embodiments, the source/drain regions and the extension region may include a same material and composition.

An integrated circuit device may include a channel region on a substrate, and the channel region may include impurities having a first conductivity type. The integrated circuit device may also include a gate electrode on the channel region and source/drain regions on respective opposing sides of the channel region. The source/drain regions may be spaced apart from each other in a first direction and may include impurities having a second conductivity type that is different from the first conductivity type. The integrated circuit device may further include an extension region between the channel region and one of the source/drain regions, and the extension region may include impurities having the second conductivity type and may have a cross-sectional area perpendicular to the first direction that is less than those of the channel region and the one of the source/drain regions.

In various embodiments, the channel region may overlap with the gate electrode in plan view, and the cross-sectional area of the channel region perpendicular to the first direction may be uniform.

According to various embodiments, the cross-sectional area of the extension region may decrease along the first direction toward the one of the source/drain regions.

According to various embodiments, an impurity concentration of the source/drain regions may be greater than an impurity concentration of the extension region.

BRIEF DESCRIPTION OF THE DRAWINGS

FIGS. 2 and 3 are cross-sectional views, taken along the line A-A' of FIG. 1, illustrating integrated circuit devices according to some embodiments of the present inventive concepts.

FIGS. 4A, 5 and 6 are plan views of FIG. 1 illustrating integrated circuit devices according to some embodiments of the present inventive concepts.

FIG. 4B is a cross-sectional view taken along the line B-B' of FIG. 4A.

DETAILED DESCRIPTION

Figure 1:
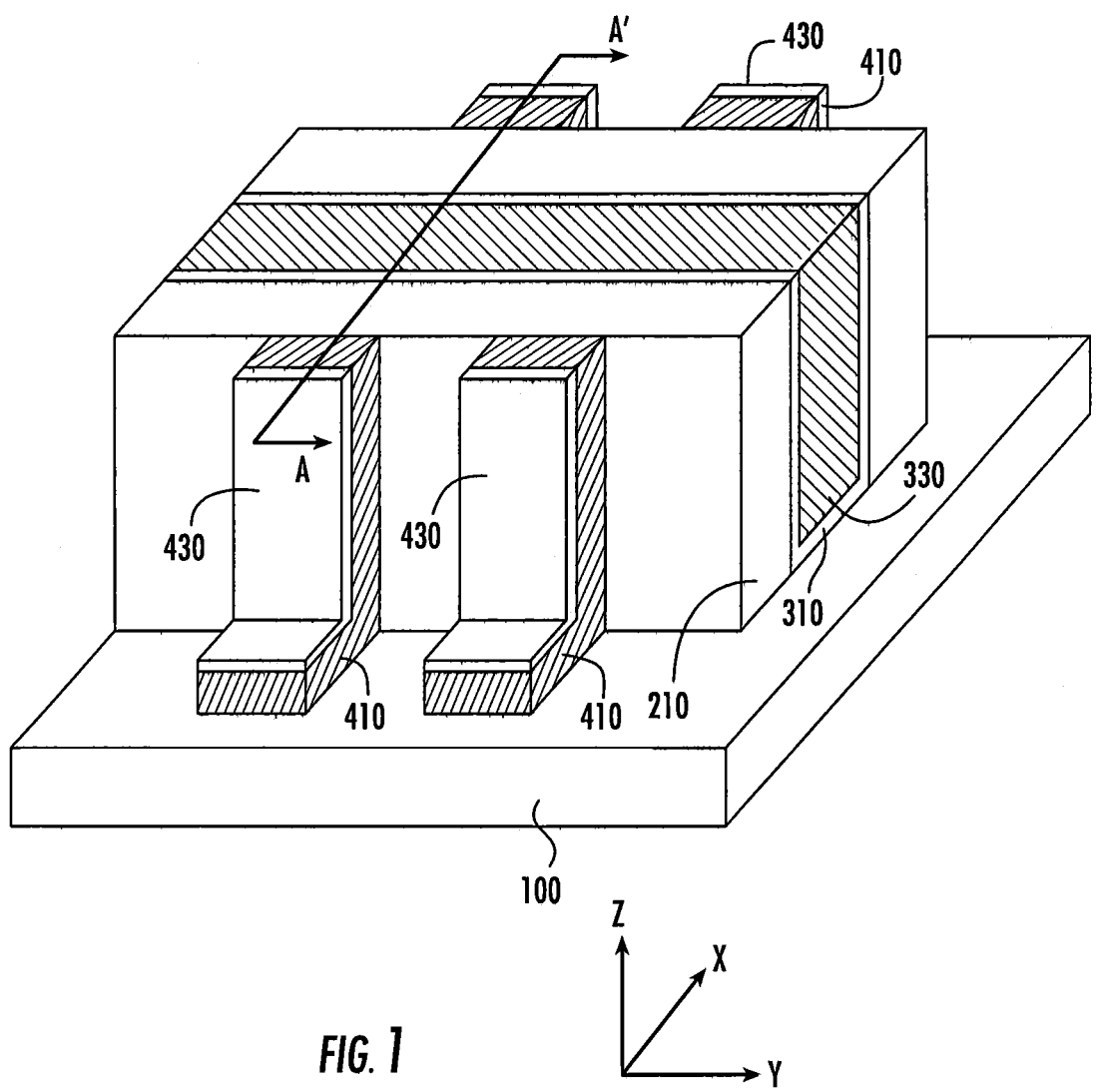
FIG. 1 is a perspective view illustrating an integrated circuit device according to some embodiments of the present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the present inventive concepts are described herein with reference to cross-sectional or perspective views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concepts should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

Using high mobility channel materials may not improve device performances as anticipated due to a higher leakage current in a drain region. As appreciated by the present inventors, localized confinement in a high gate-drain field region may increase a bandgap and may decrease Band to Band Tunneling (BTBT) leakage current in a drain region. In some embodiments according to the present inventive concepts, integrated circuit devices may include a source/drain extension region that has a portion having a cross-sectional area smaller than a cross-sectional area of a channel region, and junctions may be formed adjacent the portion of the source/drain extension region that has a cross-sectional area smaller than a cross-sectional area of the channel region.

Figure 2:
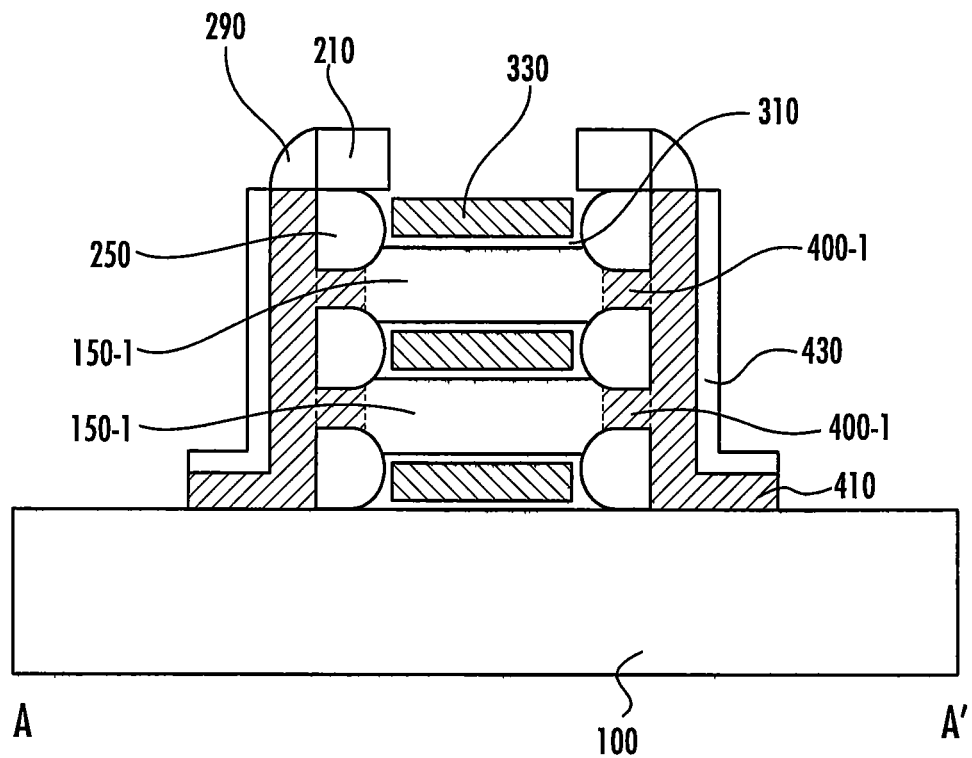
Figure 4A:
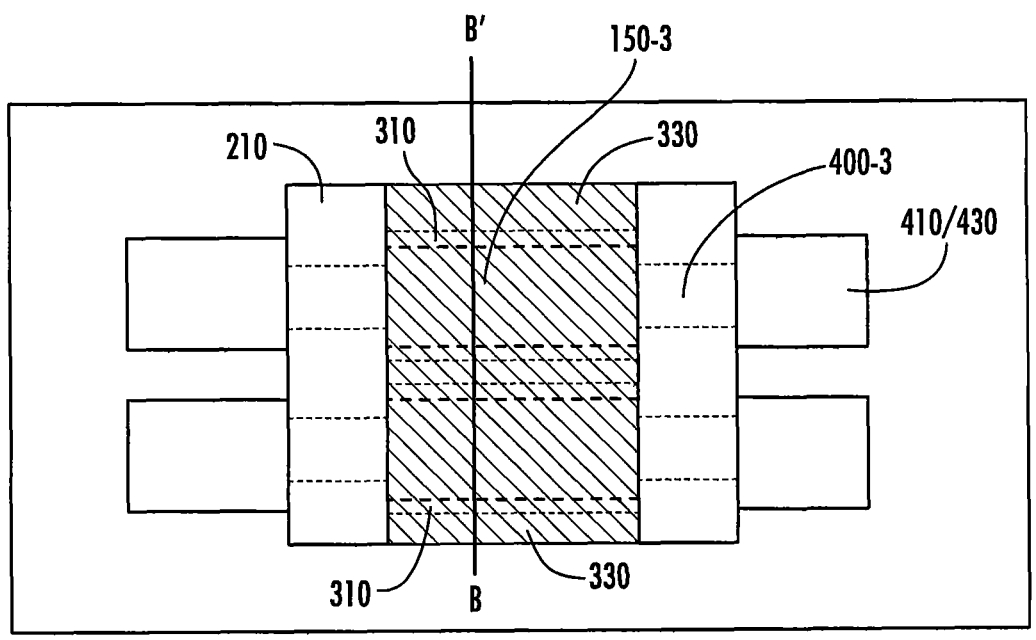
Figure 4A:
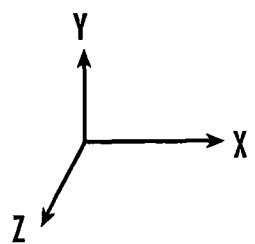

FIG. 1 is a perspective view illustrating an integrated circuit device according to some embodiments of the present inventive concepts. FIGS. 2 and 3 are cross-sectional views, taken along the line A-A' of FIG. 1, illustrating an integrated circuit device according to some embodiments of the present inventive concepts. FIGS. 4A, 5 and 6 are plan views of FIG. 1 illustrating an integrated circuit device according to some embodiments of the present inventive concepts, and FIG. 4B is a cross-sectional view, taken along the line B-B' of FIG. 4A.

Referring to FIGS. 1 and 2, an integrated circuit device may include a substrate 100. The substrate 190 may be a bulk silicon substrate, a semiconductor on insulator (SOI) substrate or an insulator (e.g., buried oxide) on a substrate. In some embodiments, the substrate 100 may include one or more semiconductor materials, for example, silicon (Si), germanium (Ge), silicon germanium (SiGe), gallium arsenide (GaAs) or silicon germanium carbon (SiGeC).

The device may include channel regions 150-1 on the substrate 100. The channel regions 150-1 may include, for example, indium gallium arsenide (InGaAs), indium antimonide (InSb), silicon (Si), silicon germanium (SiGe) and/or germanium (Ge). Each of the channel regions 150-1 may have opposing sides that are spaced apart from each other in a first horizontal direction (X direction). The X direction may be substantially parallel to a surface of the substrate 100. Each of the channel regions 150-1 may have a middle portion in the X direction that has a substantially uniform thickness in a vertical direction (Z direction) along the X direction as illustrated in FIG. 2. The Z direction may be substantially perpendicular to the surface of the substrate 100. The thickness of the middle portion of the channel regions 150-1 in the Z direction may be greater than about 6 nm. The thickness of the middle portion of the channel regions 150-1 may be determined to provide sufficient carrier mobility. Although FIG. 2 shows two channel regions 150-1, the inventive concepts are not limited thereto. In some embodiments, the device may include more than three channel regions stacked on the substrate 100 in the Z direction.

The device may also include source/drain regions 410 on the opposing sides of the channel regions 150-1 and source/drain extension regions 400-1 between the channel regions 150-1 and the source/drain regions 410. In some embodiments, the source/drain regions 410 and the source/drain extension regions 400-1 may include materials substantially same as the channel regions 150-1. In some embodiments, the source/drain regions 410 and the source/drain extension regions 400-1 may include the same material and composition. The source/drain regions 410 an the source/drain extension region 400-1 may include first impurities having a first conductivity type, and a first impurity concentration of the source/drain regions 410 may be greater than a first impurity concentration of the source/drain extension regions 400-1. The channel regions 150-1 may include second impurities having a second conductivity type that is different from the first conductivity type.

The source/drain extension regions 400-1 may have a portion having a thickness in the Z direction that is less than the thickness of the the middle portion of the channel regions 150-1 in the Z direction to suppress Band to Band Tunneling (BTBT) current between the channel regions 150-1 to the source/drain regions 410. The source/drain extension regions 400-1 may have a varying thickness in the Z direction that decreases along the X direction from the channel regions 150-1 to the source/drain regions 410 and may have a minimum thickness adjacent the source/drain regions 410 as illustrated in FIG. 2. The minimum thickness of the source/drain extension regions 400-1 in the Z direction may be about 2 nm to about 4 nm. In some embodiments, a portion of the channel regions 150-1 adjacent the source/drain extension regions 400-1 may have a thickness in the Z direction that is less than the thickness of the middle portion of the channel regions 150-1 in the Z direction.

In some embodiments, the channel regions 150-1 and the source/drain extension regions 400-1 may have substantially the same width in a second horizontal direction (Y direction) and a cross-sectional area of the channel regions 150-1 (e.g., the middle portion of the channel regions 150-1) perpendicular to the X direction may be greater than a cross-sectional area of the source/drain extension regions 400-1 perpendicular to the X direction. The Y direction may be substantially parallel to the surface of the substrate 100 and may be substantially perpendicular to the X direction. For example, the channel regions 150-1 and the source/drain extension regions 400-1 may have a width in the Y direction of greater than about 6 nm.

Each of the source/drain regions 410 may be disposed on sides of the source/drain extension regions 400-1 and may be connected to the channel regions 150-1 through the source/drain extension regions 400-1. The source/drain regions 410 may have a thickness in the Z direction of greater than about 4 nm. In some embodiments, the source/drain regions 410 and the source/drain extension regions 400-1 may have substantially the same width in the Y direction, and a cross-sectional area of the source/drain regions 410 perpendicular to the X direction may be greater than the cross-sectional area of the source/drain extension regions 400-1 perpendicular to the X direction.

Contact regions 430 may be disposed on the respective source/drain regions 410. The contact regions 430 may contact upper surfaces of the source/drain regions 410. For example, the contact regions 430 may include metal silicide. The contact regions 430 may contact a conductive layer, which electrically connects the source/drain regions 410 to various components of the integrated circuit device, for example, a bit line or a capacitor. The conductive layer may include a metal or a metal alloy. Source/drain spacers 290 may be disposed on the source/drain regions 410.

Still referring to FIG. 2, the device may further include a gate insulating layer 310 and a gate electrode 330 sequentially disposed on the channel regions 150-1. The gate electrode 330 may wrap around the individual channel regions 150-1 to form a gate-all-around (GAA) FET. In some embodiments, the gate electrode 330 may have a width in the X direction that is not greater than a width of the channel regions 150-1 in the X direction. In some embodiments, a junction (e.g., P-N junction) may be formed outside of an edge of the gate electrode 330 such that the gate electrode 330 may not overlie the junction. The junction may be formed in the source/drain extension regions 400-1. The junction may be formed in a portion of the source/drain extension regions 400-1 that has a thickness in the Z direction less than the thickness of the channel regions 150-1. In some embodiments, portions of the channel regions 150-1 that vertically overlap with the gate electrode 330 may have a substantially uniform thickness in the Z direction.

The gate insulating layer 310 may be disposed between the gate electrode 330 and the channel regions 150-1 and on sides of the gate electrode 330. In some embodiments, the gate insulating layer 310 may include a high-k material having a higher dielectric constant than silicon oxide such as, for example, hafnium oxide ($HfO_2$), lanthanum oxide, ($La_2O_3$), zirconium oxide, ($ZrO_2$) and/or tantalum oxide ($Ta_2O_5$). The gate electrode 330 may include first and second gate electrodes stacked sequentially. For example, the first gate electrode may include one of TiN, TaN, TiC and TaC, and the second gate electrode may include W or Al.

Insulation layers 250 may be disposed between the gate electrode 330 and the source/drain regions 410. The insulation layers 250 may include, for example, a low-k material having a lower dielectric constant than silicon oxide. Gate spacers 210 may be disposed on the insulation layers 250. In some embodiments, the gate spacers 210 may overlie an interface between the channel regions 150-1 and the source/drain extension regions 400-1, and the channel regions 150-1 and the source/drain extension regions 400-1 have a thickness in the Z direction, adjacent the interface between the channel regions 150-1 and the source/drain extension regions 400-1, that is less than the thickness of the middle portion of the channel regions 150-1 in the Z direction.

FIG. 3 is a cross-sectional view, taken along the line A-A' of FIG. 1, illustrating an integrated circuit device according to some embodiments of the present inventive concepts. Referring to FIG. 3, channel regions 150-2 may be disposed on the substrate 190. Each of the channel regions 150-2 may have a middle portion in the X direction that has a substantially uniform thickness in the Z direction along the X direction as illustrated in FIG. 3. The thickness of the middle portion of the channel regions 150-2 in the Z direction may be greater than about 6 nm.

The source/drain extension regions 400-2 may have a varying thickness in the Z direction that decreases and then increases along the X direction and may have a minimum thickness adjacent a midpoint of the source/drain extension regions 400-2 in the X direction as illustrated in FIG. 3. The minimum thickness of the source/drain extension regions 400-2 in the Z direction may be about 2 nm to about 4 nm. Insulation layers 250 may include portions protruding toward the gate electrode 330 and the gate electrode 330 and may have recessed sides as illustrated in FIG. 3.

In some embodiments, a portion of the channel regions 150-2 adjacent the source/drain extension regions 400-2 may have a thickness in the Z direction that is less than the thickness of the middle portion of the channel regions 150-2 in the Z direction. In some embodiments, the gate spacers 210 may overlie an interface between the channel regions 150-2 and the source/drain extension regions 400-2, and the channel regions 150-2 and the source/drain extension regions 400-2 have a thickness in the Z direction, adjacent the interface between the channel regions 150-2 and the source/drain extension regions 400-2, that is less than the thickness of the middle portion of the channel regions 150-2 in the Z direction.

In some embodiments, the channel regions 150-2 and the source/drain extension regions 400-2 may have substantially the same width in the Y direction, and a cross-sectional area of the channel regions 150-2 (e.g., the middle portion of the channel regions 150-2) perpendicular to the X direction may be greater than a cross-sectional area of the source/drain extension regions 400-2 perpendicular to the X direction. For example, the channel regions 150-2 and the source/drain extension regions 400-2 may have a width in the Y direction of greater than about 15 nm. In some embodiments, the source/drain regions 410 and the source/drain extension regions 400-2 may have substantially the same width in the Y direction, and a cross-sectional area of the source/drain regions 410 perpendicular to the X direction may be greater than the cross-sectional area of the source/drain extension regions 400-2 perpendicular to the X direction.

FIG. 4A is a plan view of FIG. 1 illustrating an integrated circuit device according to some embodiments of the present inventive concepts, and FIG. 4B is a cross-sectional view, taken along the line B-B' of FIG. 4A. Referring to FIG. 4B, a channel regions 150-3 may have a fin-shape that protrudes from the substrate 100 in the Z direction. The channel regions 150-3 may have a substantially uniform thickness in the Z direction along the X direction. The gate insulating layer 310 may be conformally disposed on the channel regions 150-3 as illustrated in FIG. 4B. The gate insulating layer 310 may have a substantially uniform thickness on the channel regions 150-3. The gate electrode 330 may be disposed on the gate insulating layer 310.

Referring to FIG. 4A, the channel regions 150-3 may have a substantially uniform width in the Y direction along the X direction. The width of the channel regions 150-3 in the Y direction may be greater than about 15 nm. Source/drain extension regions 400-3 may be disposed on opposing sides of the channel regions 150-3 that are spaced apart from each other in the X direction. The Source/drain extension regions 400-3 may be disposed between the substrate 100 and the gate spacers 210. The source/drain extension regions 400-3 may have a width in the Y direction that is less than the width of the channel regions 150-3 in the Y direction. The source/drain extension regions 400-3 may have a substantially uniform width in the Y direction along the X direction as illustrated in FIG. 4A. A width of the source/drain extension regions 400-3 may be greater than about 6 nm. In some embodiments, the channel regions 150-3 and the source/drain extension regions 400-3 may have the substantially same thickness in the Z direction, and a cross-sectional area of the channel regions 150-3 perpendicular to the X direction may be greater than a cross-sectional area of the source/drain extension regions 400-3 perpendicular to the X direction. For example, the channel regions 150-3 and the source/drain extension regions 400-3 may have a thickness in the Z direction of greater than about 6 nm.

Each of the source/drain regions 410 may be disposed on sides of the source/drain extension regions 400-3 and may be connected to the channel regions 150-3 through the source/drain extension regions 400-3. The source/drain regions 410 may have a width in the Y direction that is greater than the width of the source/drain extension regions 400-3 in the Y direction as illustrated in FIG. 4A. For example, the source/drain regions 410 may have the width in the Y direction of greater than about 6 nm. In some embodiments, the source/drain regions 410 may have a thickness in the Z direction that is substantially the same as or greater than the thickness of the source/drain extension regions 400-3 in the Z direction, and a cross-sectional area of the source/drain regions 410 perpendicular to the X direction may be greater than the cross-sectional area of the source/drain extension regions 400-3 perpendicular to the X direction.

FIG. 5 is a plan view of FIG. 1 illustrating an integrated circuit device according to some embodiments of the present inventive concepts. Referring to FIG. 5, the device may include fin spacers 280 and fin barriers 285 disposed on sides of the source/drain extension regions 400-4. The gate spacers 210 may be formed on upper surfaces of the source/drain extension regions 400-4, the fin spacers 280 and the fin barriers 285.

The channel regions 150-4 may have a substantially uniform width in the Y direction along the X direction. The width of the channel regions 150-4 in the Y direction may be greater than about 6 nm. The source/drain extension regions 400-4 may have a width in the Y direction that is less than the width of the channel regions 150-4 in the Y direction. The source/drain extension regions 400-4 may have a substantially uniform width in the Y direction along the X direction as illustrated in FIG. 5, and a width of the source/drain extension regions 400-4 may be about 2 nm to about 4 nm. In some embodiments, the channel regions 150-4 and the source/drain extension regions 400-4 may have the substantially same thickness in the Z direction, and a cross-sectional area of the channel regions 150-4 perpendicular to the X direction may be greater than a cross-sectional area of the source/drain extension regions 400-4 perpendicular to the X direction. For example, the channel regions 150-4 and the source/drain extension regions 400-4 may have a thickness in the Z direction of greater than about 6 nm.

Each of the source/drain regions 410 may be disposed on sides of the source/drain extension regions 400-4 and may have a width in the Y direction that is greater than the width of the source/drain extension regions 400-4 in the Y direction as illustrated in FIG. 5. For example, the source/drain regions 410 may have the width in the Y direction of greater than about 15 nm. In same embodiments, the source/drain regions 410 may have a thickness in the Z direction that is substantially the same as or greater than the thickness of the source/drain extension regions 400-4 in the Z direction, and a cross-sectional area of the source/drain regions 410 perpendicular to the X direction may be greater than the cross-sectional area of the source/drain extension regions 400-4 perpendicular to the X direction.

FIG. 6 is a plan view of FIG. 1 illustrating an integrated circuit device according to some embodiments of the present inventive concepts. Referring to FIG. 6, the channel regions 150-5 may have a substantially uniform width in the Y direction along the X direction. The width of the channel regions 150-5 in the Y direction may be greater than about 6 nm.

The source/drain extension regions 400-5 may have a portion having a width in the Y direction that is less than the width of the channel regions 150-5 in the Y direction. The source/drain extension regions 400-5 may have a varying width in the Y direction along the X direction as illustrated in FIG. 6. The width of the source/drain extension regions 400-5 in the Y direction may decrease and then increase along the X direction and may have a minimum width adjacent a midpoint of the source/drain extension regions 400-5 in the X direction. The minimum width of the source/drain extension regions 400-5 in the Y direction may be about 2 nm to about 4 nm. In some embodiments, the channel regions 150-5 and the source/drain extension regions 400-5 may have the substantially same thickness in the Z direction, and a cross-sectional area of the channel regions 150-5 perpendicular to the X direction may be greater than a cross-sectional area of the source/drain extension regions 400-5 perpendicular to the X direction. For example, the channel regions 150-5 and the source/drain extension regions 400-5 may have a thickness in the Z direction of greater than about 6 nm.

Each of the source/drain regions 410 may be disposed on sides of the source/drain extension regions 400-5 and may have a width in the Y direction that is greater than the width of the source/drain extension regions 400-5 in the Y direction as illustrated in FIG. 6. For example, the source/drain regions 410 may have the width in the Y direction of greater than about 10 nm. In some embodiments, the source/drain regions 410 may have a thickness in the Z direction that is substantially the same as or greater than the thickness of the source/drain extension regions 400-5 in the Z direction, and a cross-sectional area of the source/drain regions 410 perpendicular to the X direction may be greater than the cross-sectional area of the source/drain extension regions 400-5 perpendicular to the X direction.

Figure 7A:
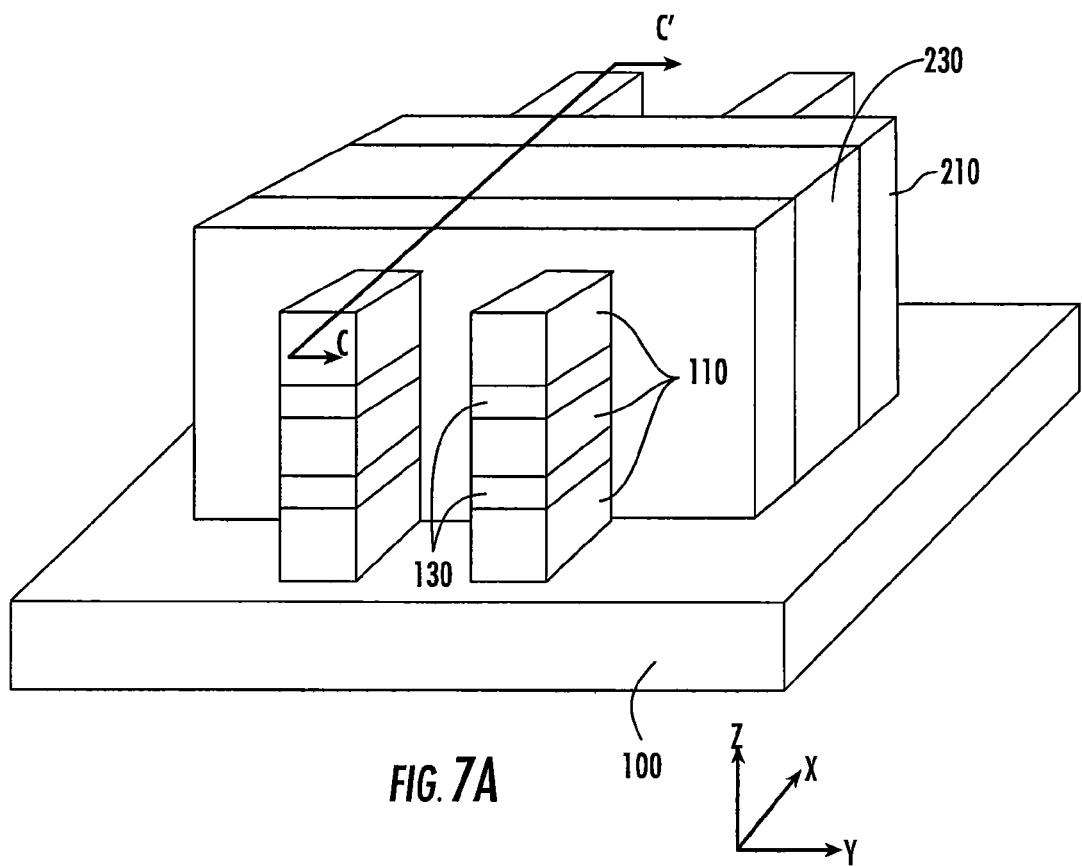
FIG. 7A is a perspective view and FIGS. 7B and 8 through 13 are cross-sectional views, taken along the line C-C' of FIG. 7A, illustrating intermediate structures provided as portions of a method of forming an integrated circuit device according to some embodiments of the present inventive concepts.
Figure 7B:
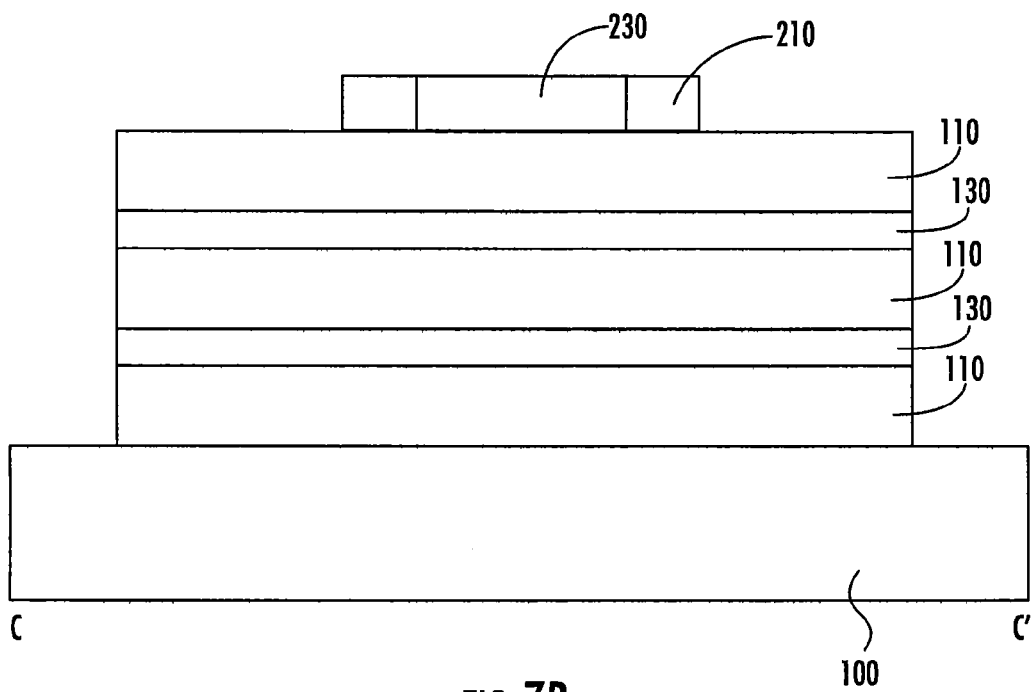

FIG. 7A is a perspective view and FIGS. 7B and 8 through 13 are cross-sectional views, taken along the line C-C' of FIG. 7A, illustrating intermediate structures provided as portions of a method of forming an integrated circuit device according to some embodiments of the present inventive concepts. Referring to FIGS. 7A and 7B, stacks including sacrificial layers 110 and channel layers 130 may be formed on the substrate 100. The sacrificial layers 110 may have etch selectivity with respect to the channel layers 130. The channel layers 130 may be nanosheets having a thickness in the Z direction in a range of about 6 nm to about 10 nm. The stacks may have a line shape extending in the X direction. A dummy gate electrode 230 may be formed on the stacks, and gate spacers 210 may be formed on sides of the dummy gate electrode 230. The dummy gate electrode 230 may have a line shape extending in the Y direction and may cross the stacks. For example, the dummy gate electrode 230 may include poly-silicon, and the gate spacers 210 may include silicon nitride.

Figure 8:
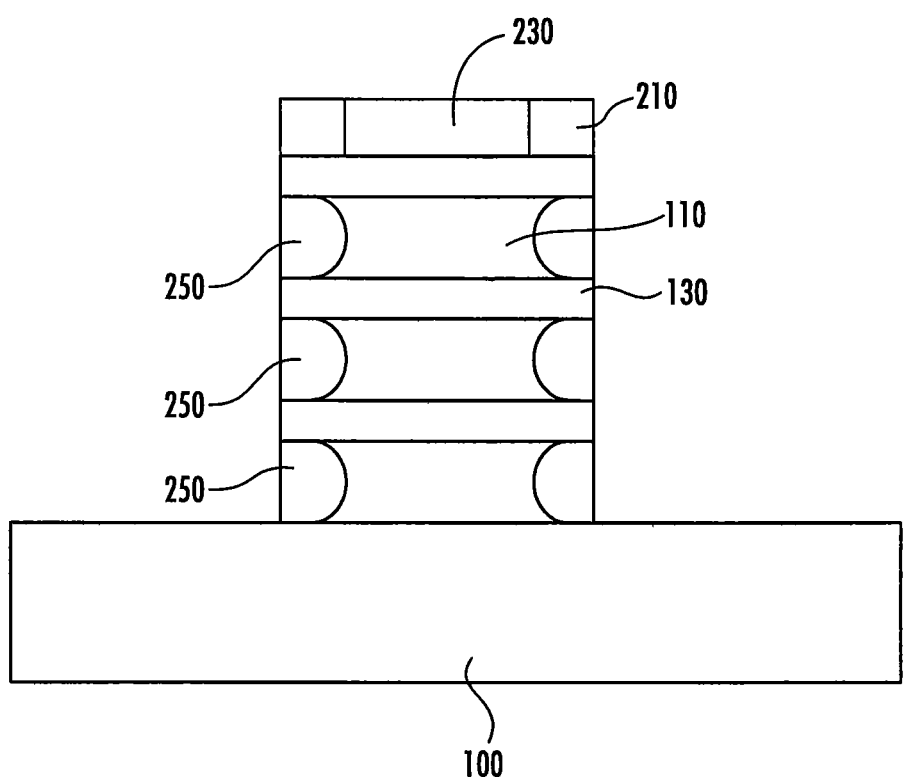

Referring to FIG. 8, the sacrificial layers 110 and the channel layers 130 may be etched using the dummy gate electrode 230 and the gate spacers 210 as an etch mask until the substrate 100 is exposed. Sides of the sacrificial layers 110 may be selectively etched to form recesses and then insulation layers 250 may be formed in the recesses. In some embodiments, the insulation layers 250 may be formed by forming a preliminary insulation layers that fill the recesses and on sides of the channel layers 130 and performing an anisotropic etching process to remove portions of the preliminary insulation layers formed on the sides of the channel layers 130. The insulation layers 250 may include a low-k material that has a dielectric constant lower than silicon oxide.

Figure 9:
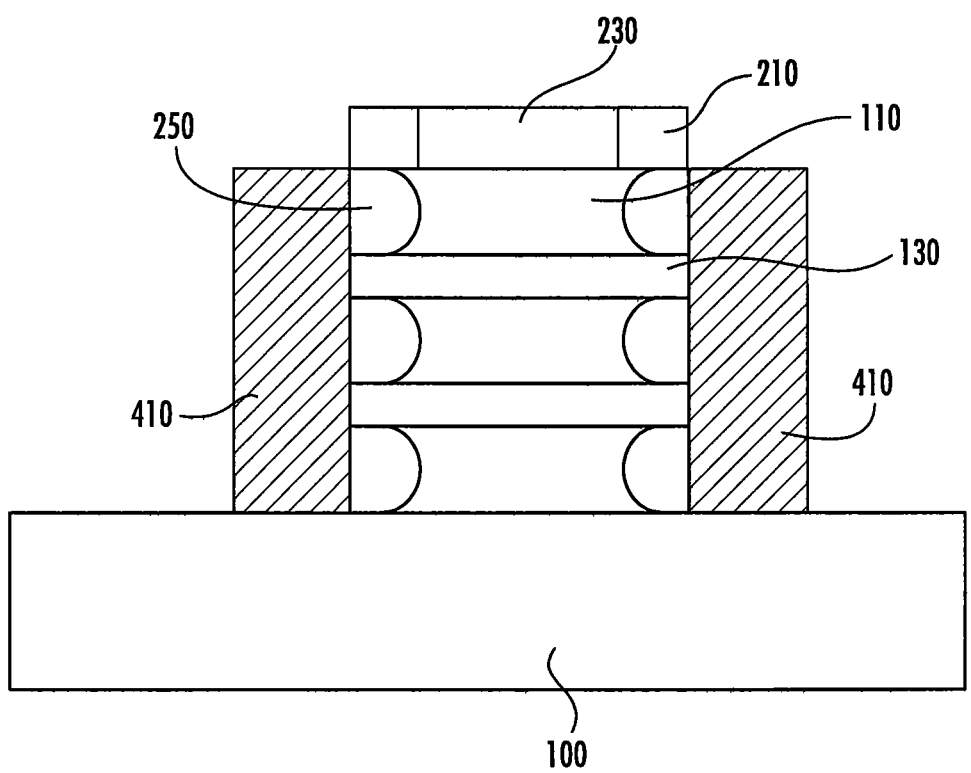
Figure 10:
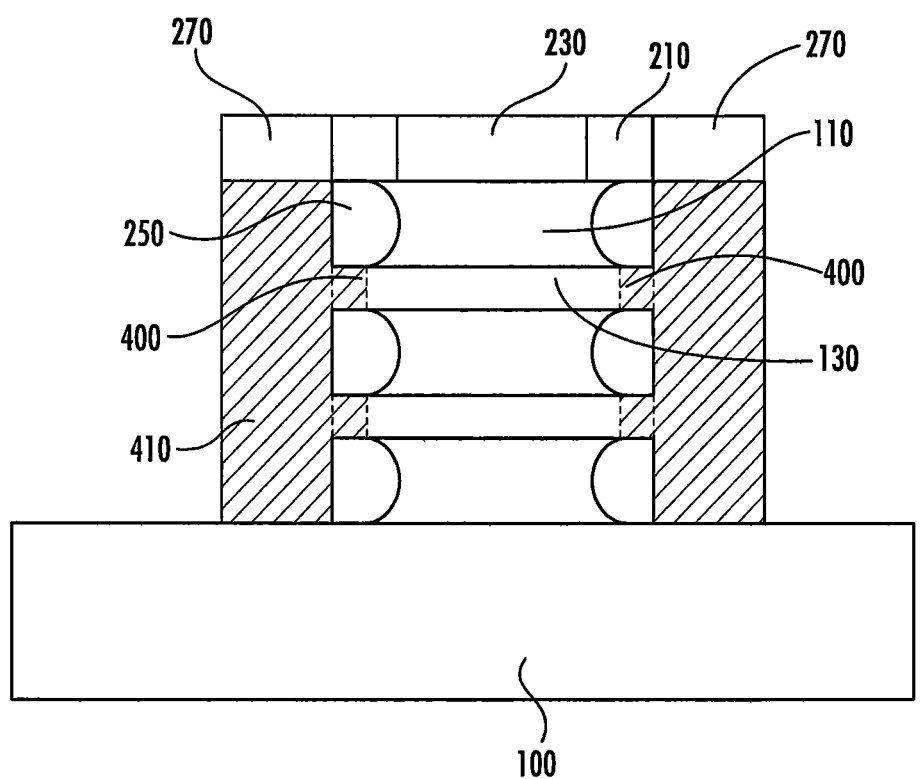

Referring to FIG. 9, source/drain regions 410 may be formed on the sides of the channel layers 130. In some embodiments, the source/drain regions 410 may be formed by performing an epitaxial growth process using the channel layers 130 a seed layer. In some embodiments, the source/drain regions 410 may be formed by performing an epitaxial growth process using the substrate 100 a seed layer. The source/drain regions 410 may include first impurities having a first conductivity type that is different from a second conductivity type of second impurities in the channel layers 130. In some embodiments, an ion implantation process and/or a plasma doping process may be performed to include first impurities having the first conductivity type in side portions of the channel layers 130 before forming the source/drain regions 410.

Figure 19:
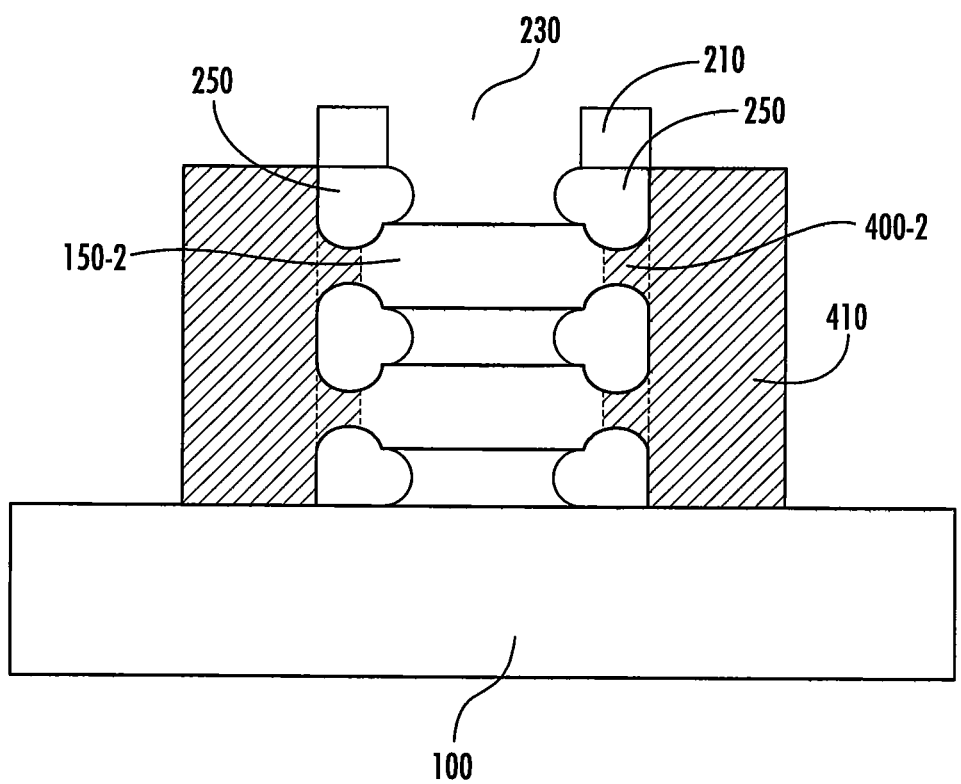

Referring to FIG. 19, a process (e.g., an anneal process) may be performed to form preliminary source/drain extension regions 400 between the channel layers 130 and the source/drain region 410. The first impurities in the source/drain regions 410 may diffuse into the channel layers 130 by the process (e.g., anneal process) to form the preliminary source/drain extension regions 400. Protecting layers 270 may be formed on the source/drain regions 410. The protecting layers 270 may include, for example, silicon oxide.

Figure 11:
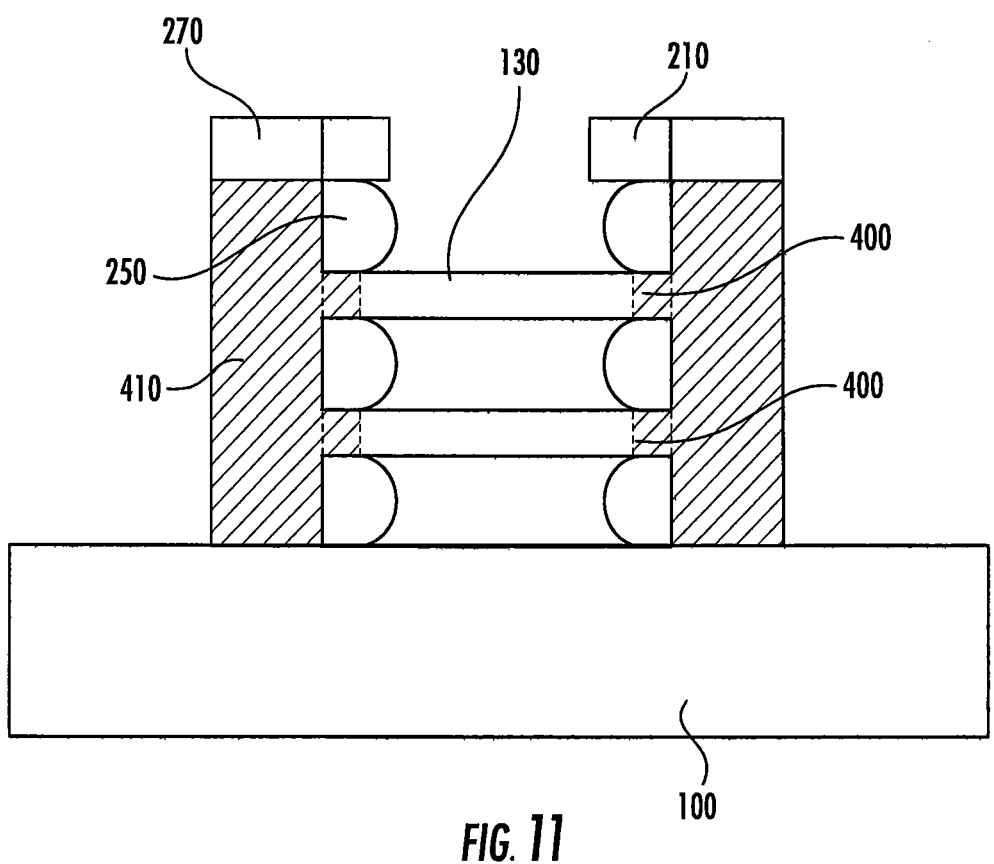

Referring to FIG. 11, the dummy gate electrode 230 and the sacrificial layers 110 may be removed. The sacrificial layers 110 may have etch selectivity with respect to the channel layers 130 and may be selectively removed. The protecting layers 270 may protect the source/drain regions 410 during removing the dummy gate electrode 230 and the sacrificial layers 110.

Figure 12:
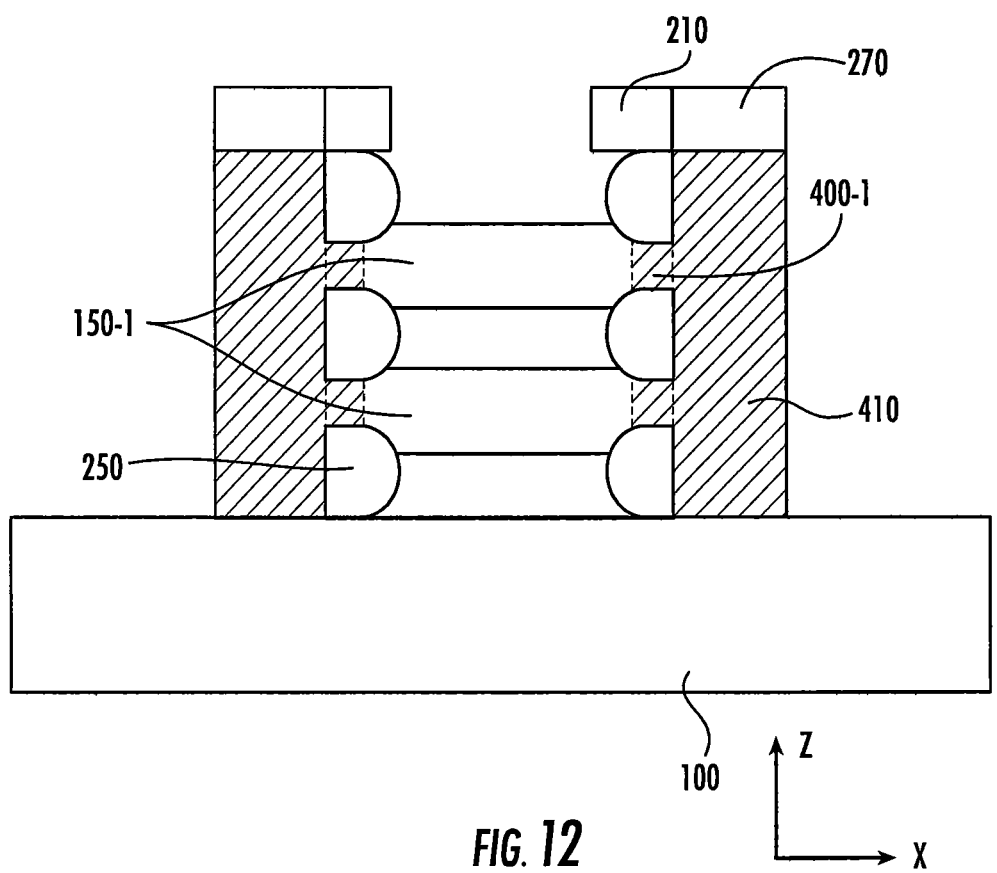

Referring to FIG. 12, an epitaxial growth process may be performed using the channel layers 130 as seed layer to form channel regions 150-1 and source/drain extension regions 400-1. A thickness of the channel regions 150-1 in the Z direction may be greater than a thickness of the source/drain extension regions 400-1. The channel regions 150-1 may have a middle portion in the X direction that has a substantially uniform thickness in the Z direction along the X direction, and the source/drain extension regions 400-1 may have a varying thickness in the Z direction as illustrated in FIG. 12. The source/drain extension regions 400-1 may have an impurity concentration less than an impurity concentration of the source/drain region 410.

Figure 13:
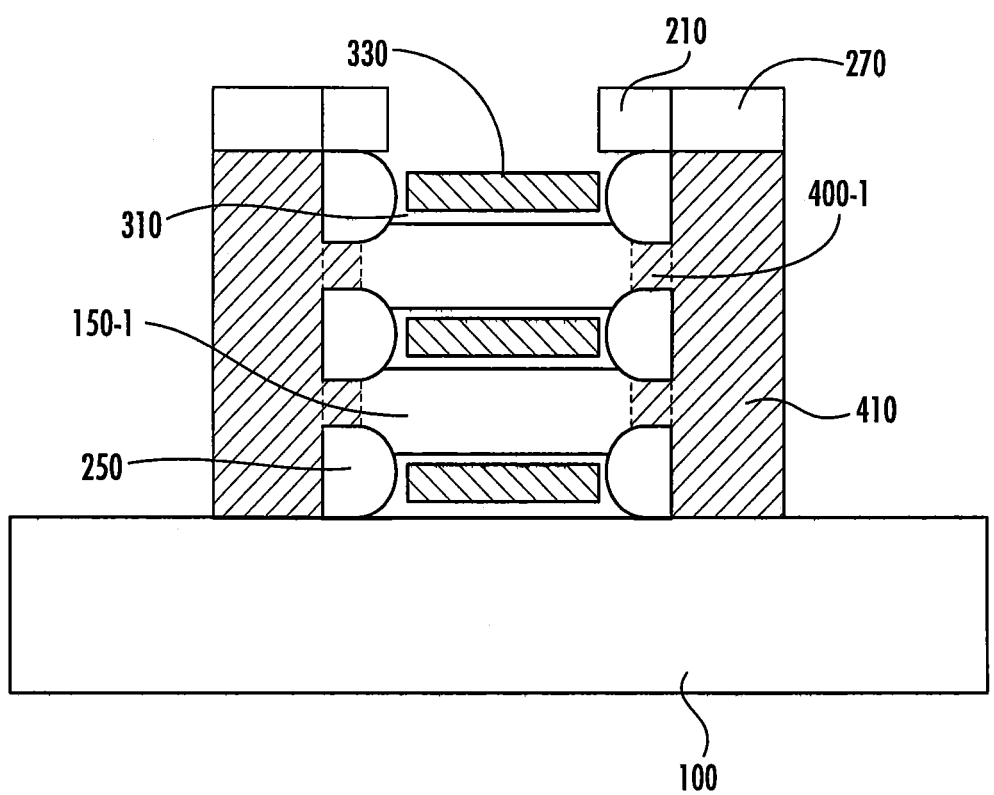

Referring to FIG. 13, a gate insulating layer 310 that wraps around the individual channel regions 150-1 may be formed, and a gate electrode 330 may be formed on the gate insulating layer 310 such that a gate-all-around (GAA) FET structure may be formed. Referring again to FIG. 2, the protecting layers 270 may be removed, and source/drain spacers 290 may be disposed on the source/drain regions 410. The source/drain regions 410 may be etched using the source/drain spacers 290 as an etch mask and contact regions 430 may be formed on upper surfaces of the source/drain regions 410.

Figure 14:
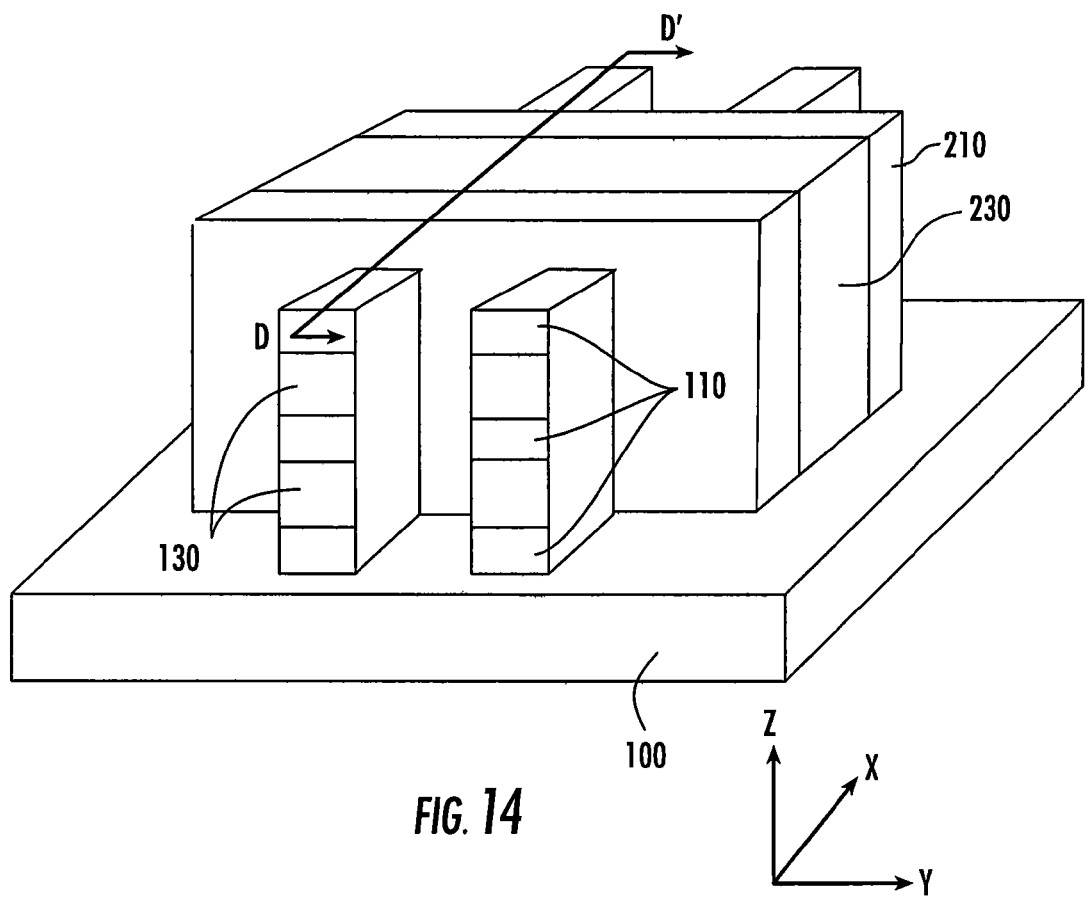
FIG. 14 is a perspective view and FIGS. 15 through 20 are cross-sectional views, taken along the line D-D' of FIG. 14, illustrating intermediate structures provided as portions of a method of forming an integrated circuit device according to some embodiments of the present inventive concepts.

FIG. 14 is a perspective view and FIGS. 15 through 20 are cross-sectional views, taken along the line D-D' of FIG. 14, illustrating intermediate structures provided as portions of a method of forming an integrated circuit device according to some embodiments of the present inventive concepts. Referring to FIG. 14, stacks including sacrificial layers 110 and channel layers 130 may be formed on the substrate 100. The stacks may have a line shape extending in the X direction. A dummy gate electrode 230 may be formed on the stacks and gate spacers 210 may be formed on sides of the dummy gate electrode 230. The dummy gate electrode 230 may have a line shape extending in the Y direction and may cross the stacks.

Figure 15:
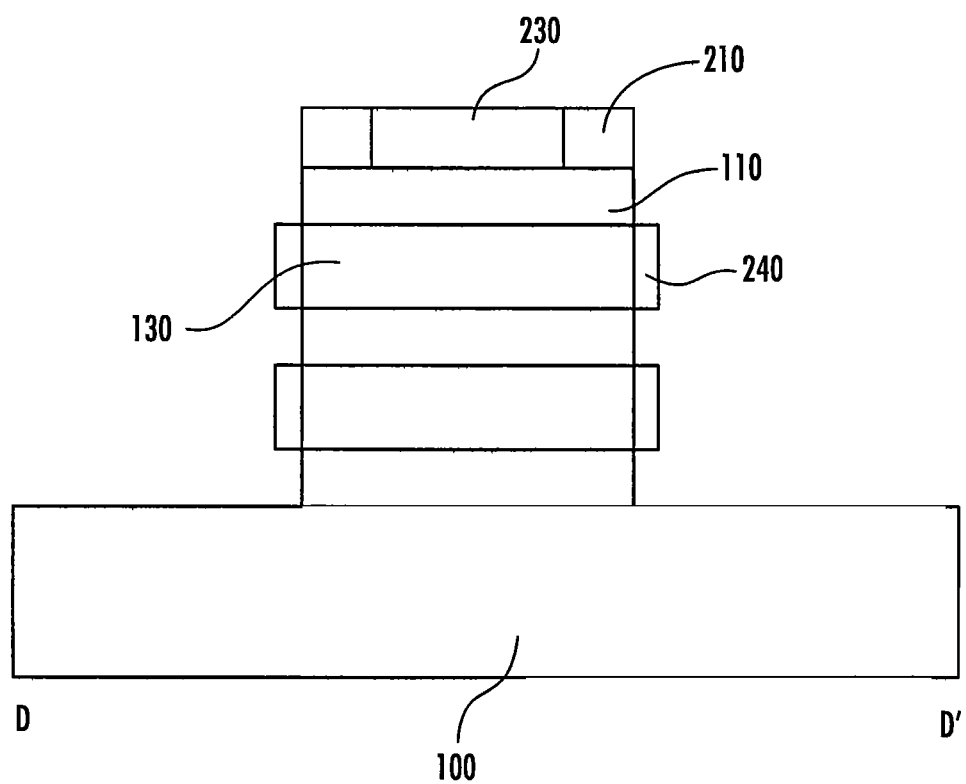

Referring to FIG. 15, the sacrificial layers 110 and the channel layers 130 may be etched using the dummy gate electrode 230 and the gate spacers 210 as an etch mask until the substrate 100 is exposed. Channel protecting layers 240 may be formed on sides of the channel layers 130. The channel protecting layers 240 may have etch selectivity with respect to the sacrificial layers 110 and the channel layers 130.

Figure 16:
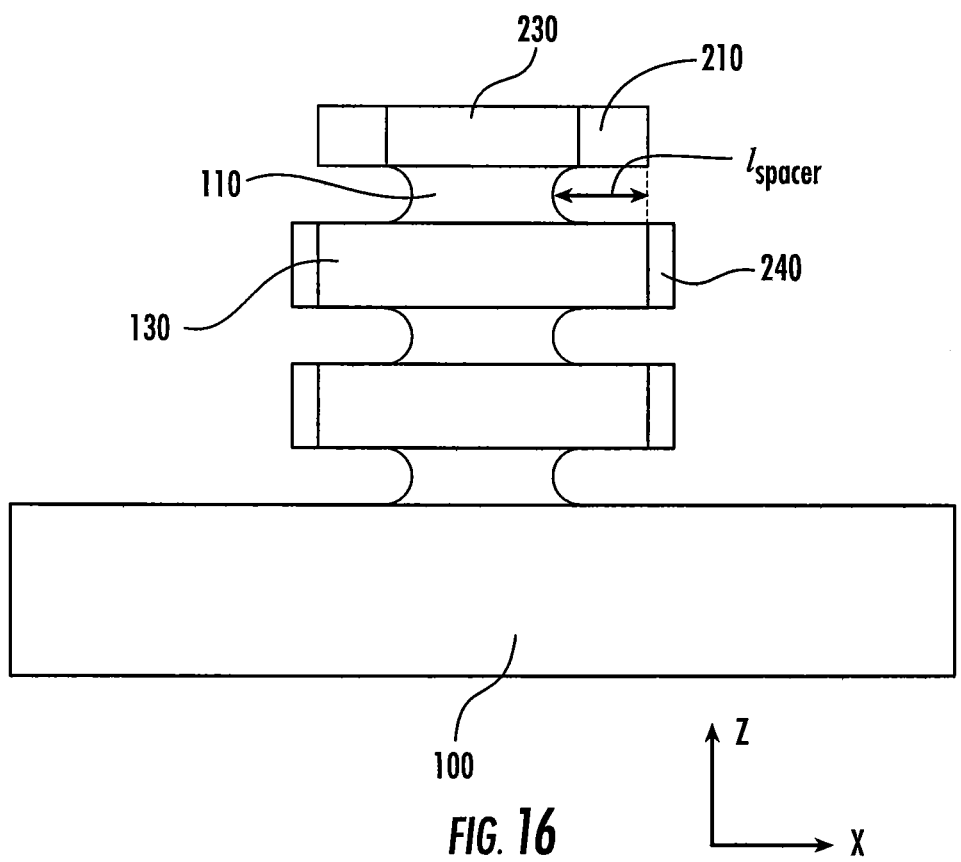

Referring to FIG. 16, sides of the sacrificial layers 110 may be selectively etched. The sacrificial layers 110 may be etched in the X direction by a distance $l_{spacer}$. The sacrificial layers 110 may have recessed sides as illustrated in FIG. 16.

Figure 17:
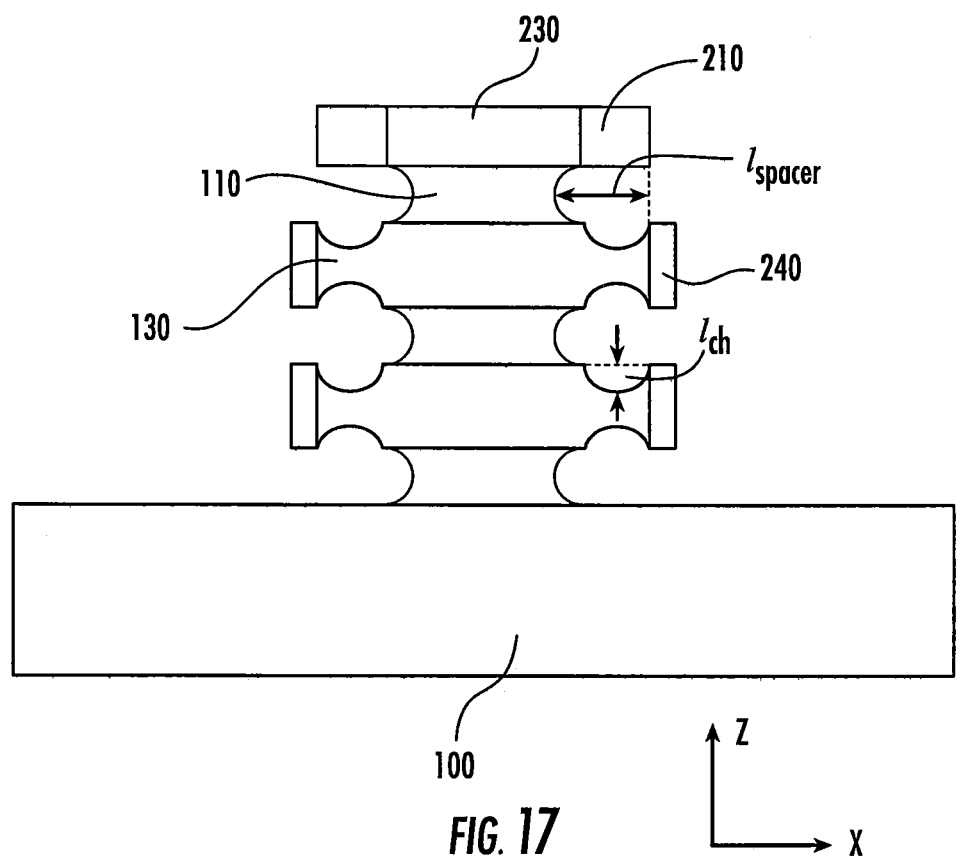

Referring to FIG. 17, portions of the channel layers 130 that are disposed under the gate spacers 210 may be etched. The channel layers 130 may be etched in the Z direction by a distance $l_{ch}$. It will be understood that $l_{spacer}$ and $l_{ch}$ may be independently determined since the sacrificial layers 110 and the channel layers 130 are etched using two separate etching processes. The portions of the channel layers 130 may have recessed upper and lower surfaces as illustrated in FIG. 17.

Figure 18:
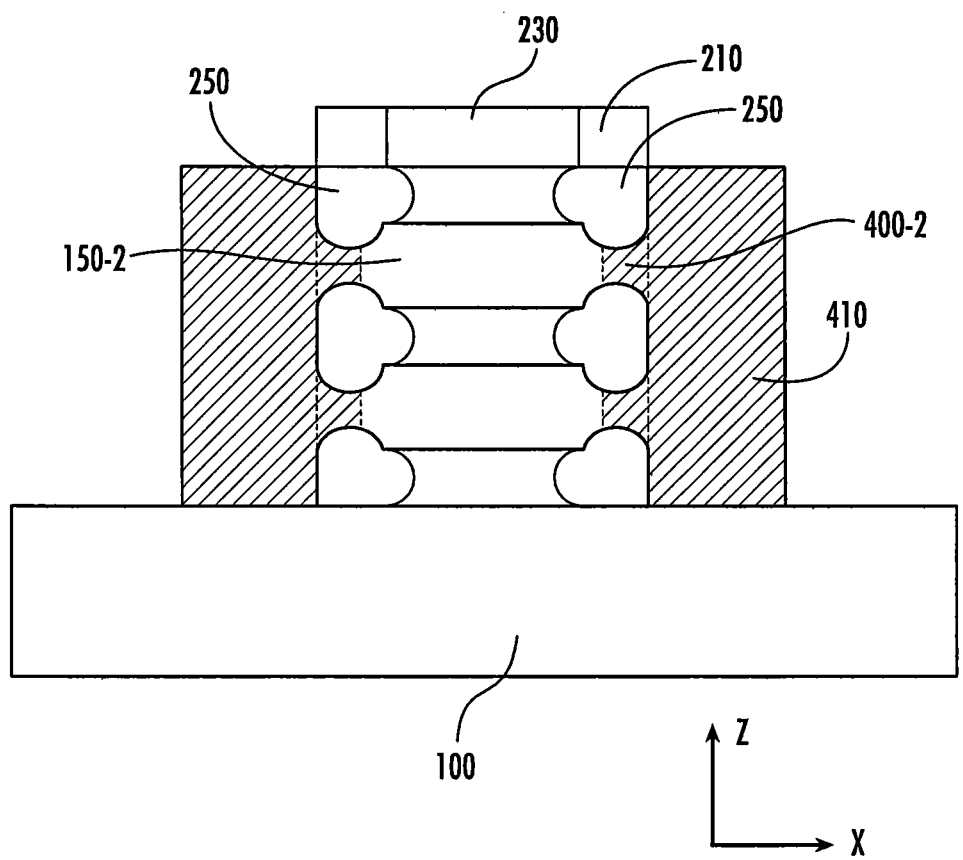

Referring to FIG. 18, the channel protecting layers 240 may be removed, and insulation layers 250 may be formed on the recessed sides of the sacrificial layers 110 and the recessed upper and lower surfaces of the channel layers 130. Source/drain regions 410 may be formed on the sides of the channel layers 130. The source/drain regions 410 may include first impurities having a first conductivity type. A process (e.g., an anneal process) may be performed to form source/drain extension regions 400-2 and channel regions 150-2. The first impurities in the source/drain regions 410 may diffuse into the channel layers 130 by the process (e.g., anneal process) to form the source/drain extension regions 400-2. In some embodiments, an ion implantation process and/or a plasma doping process may be performed to include first impurities having the first conductivity type in side portions of the channel layers 130 before forming the source/drain regions 410.

Referring to FIG. 19, the dummy gate electrode 230 and the sacrificial layers 110 may be removed. The sacrificial layers 110 may have etch selectivity with respect to the channel layers 130 and may be selectively removed.

Figure 20:
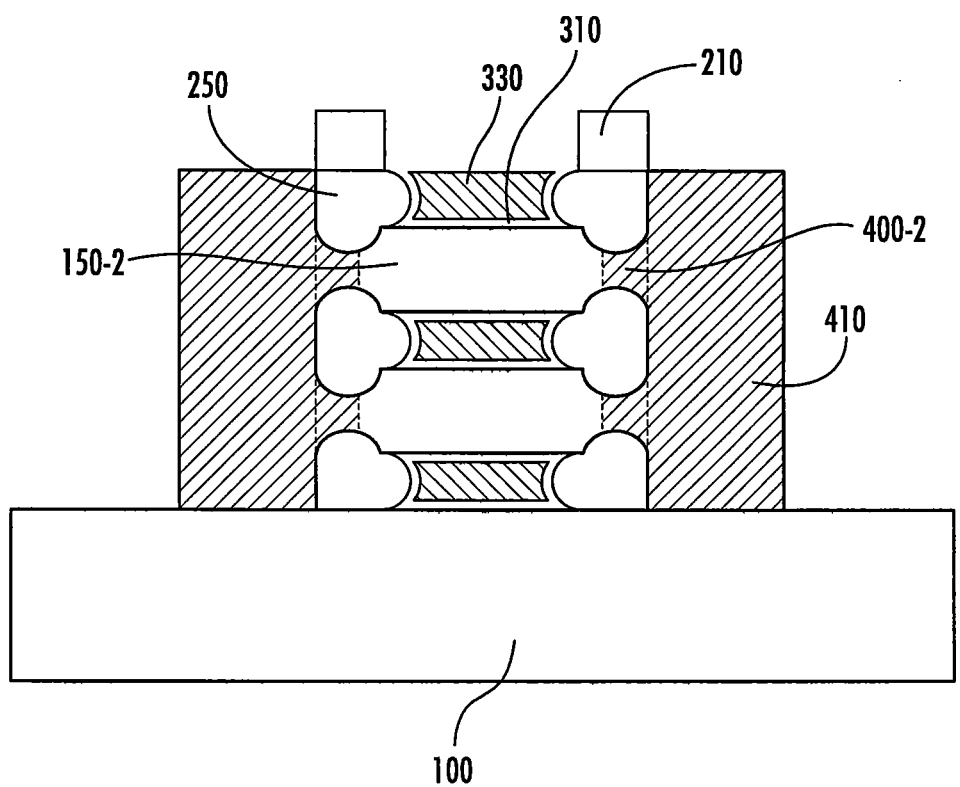

Referring to FIG. 20, a gate insulating layer 310 that wraps around the individual channel regions 150-2 may be formed, and a gate electrode 330 may be formed on the gate insulating layer 310. Referring again to FIG. 3, source/drain spacers 290 may be disposed on the source/drain regions 410. The source/drain regions 410 may be etched using the source/drain spacers 290 as an etch mask and contact regions 430 may be formed on upper surfaces of the source/drain regions 410.

Figure 21A:
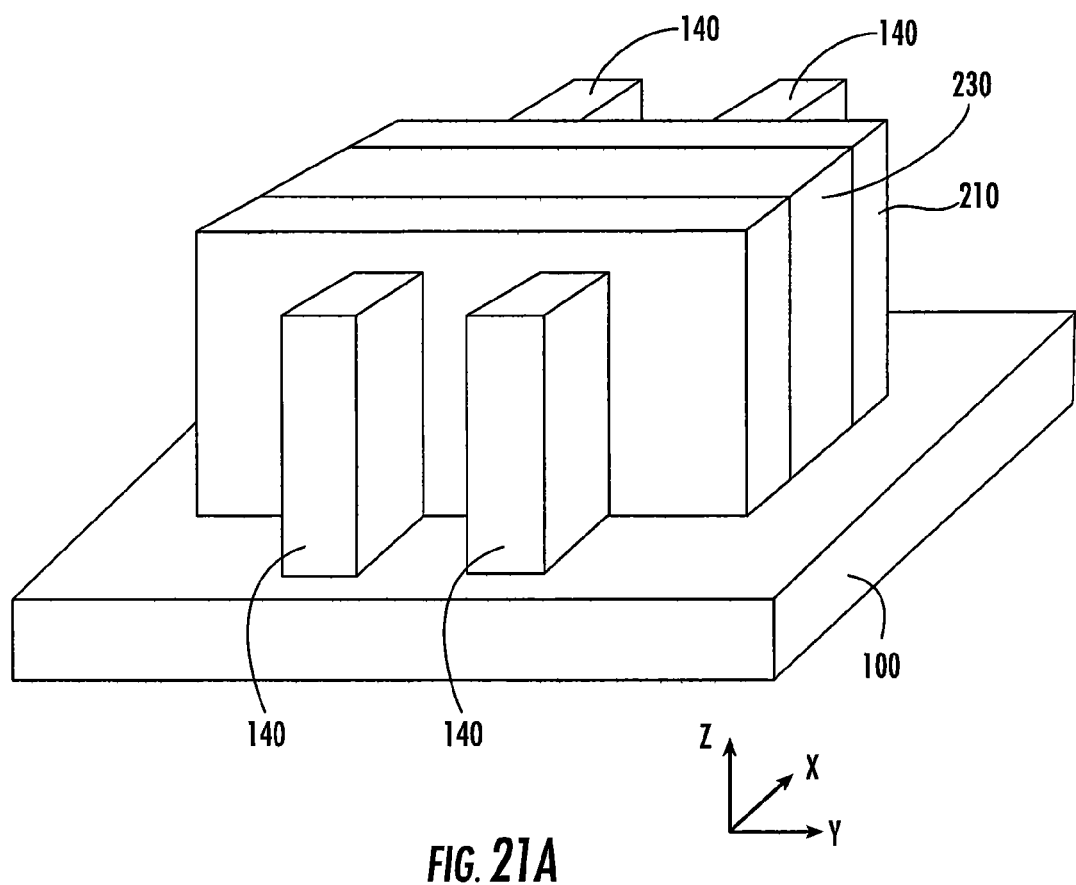
FIGS. 21A and 22A are perspective views and FIGS. 21B, 22B and 23 through 26 are plan views illustrating intermediate structures provided as portions of a method of forming an integrated circuit device according to some embodiments of the present inventive concepts.
Figure 21B:
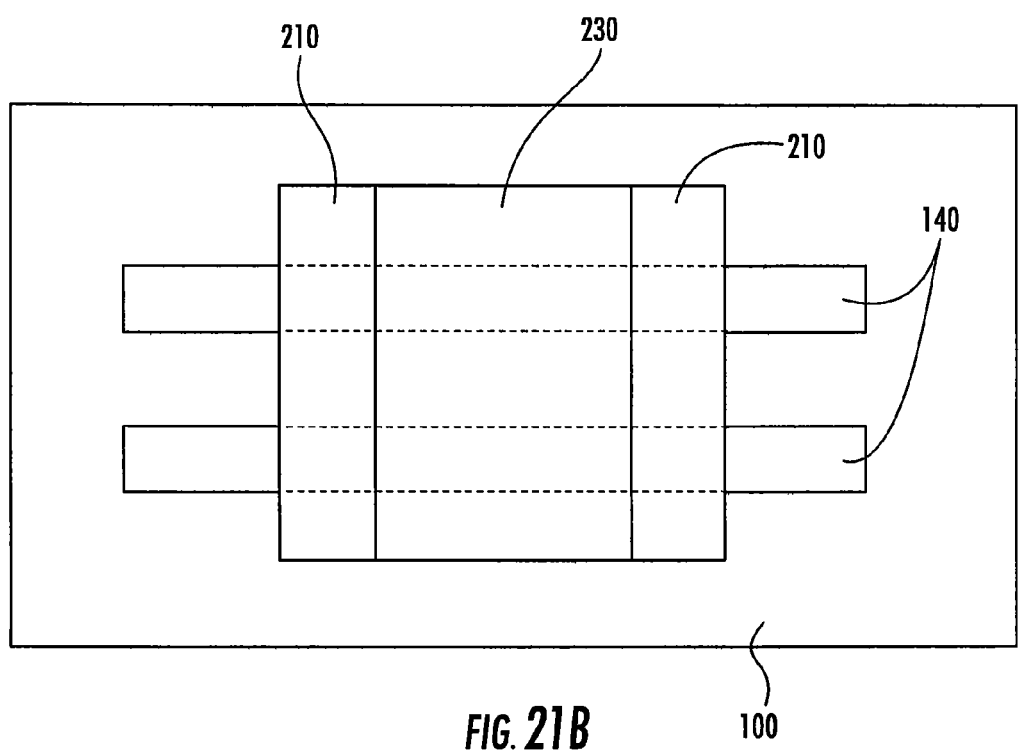
Figure 22A:
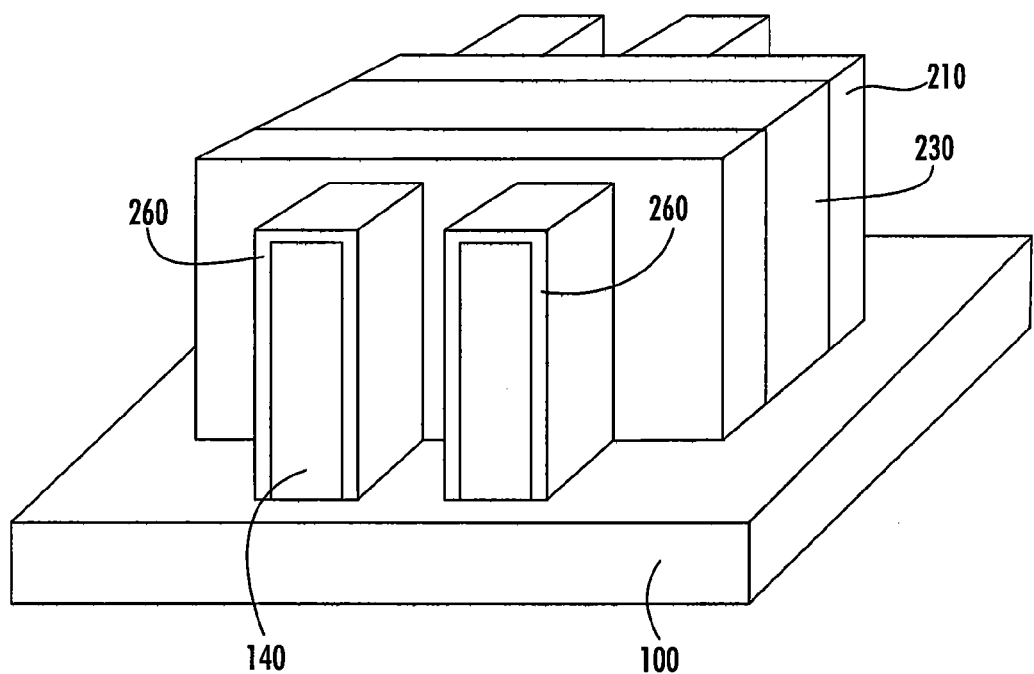

FIGS. 21A and 22A are perspective views and FIGS. 21B, 22B and 23 through 26 are plan views illustrating intermediate structures provided as portions of a method of forming an integrated circuit device according to some embodiments of the present inventive concepts. Referring to FIGS. 21A and 21B, the channel layers 140 may have a line shape that extends in the X direction. A dummy gate electrode 230 may be formed on the channel layers 140 and gate spacers 210 may be formed on sides of the dummy gate electrode 230. The dummy gate electrode 230 may have a line shape extending in the Y direction and may cross the channel layers 140.

Figure 22B:
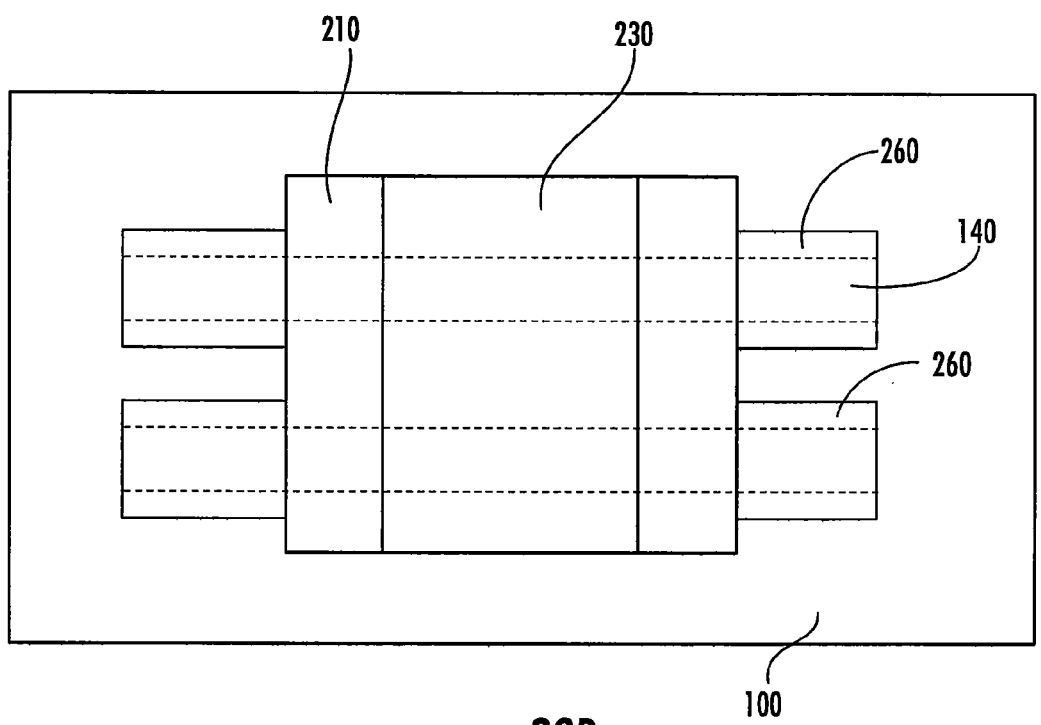

Referring to FIGS. 22A and 22B, channel protecting layers 260 may be formed on portions of the channel layers 140 exposed by the dummy gate electrode 230 and the gate spacers 210. In some embodiments, the channel protecting layers 260 may include silicon oxide and may have a substantially uniform thickness along surface of the channel layers 140 as illustrated in FIG. 22A.

Figure 23:
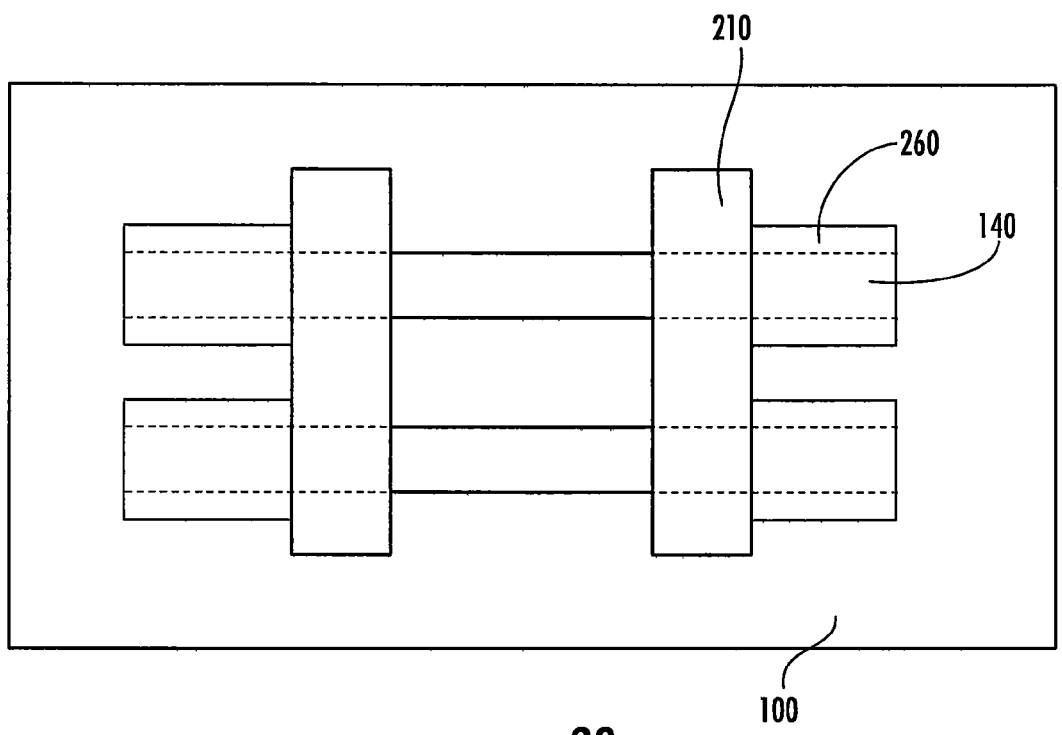
Figure 24:
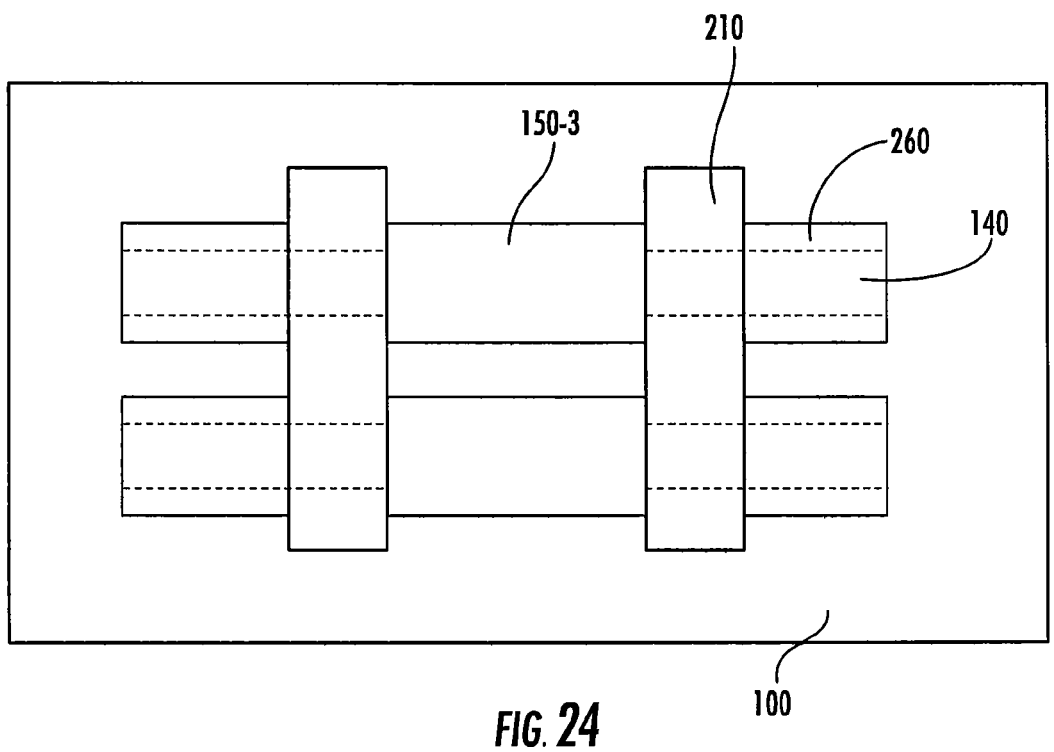
Figure 25:
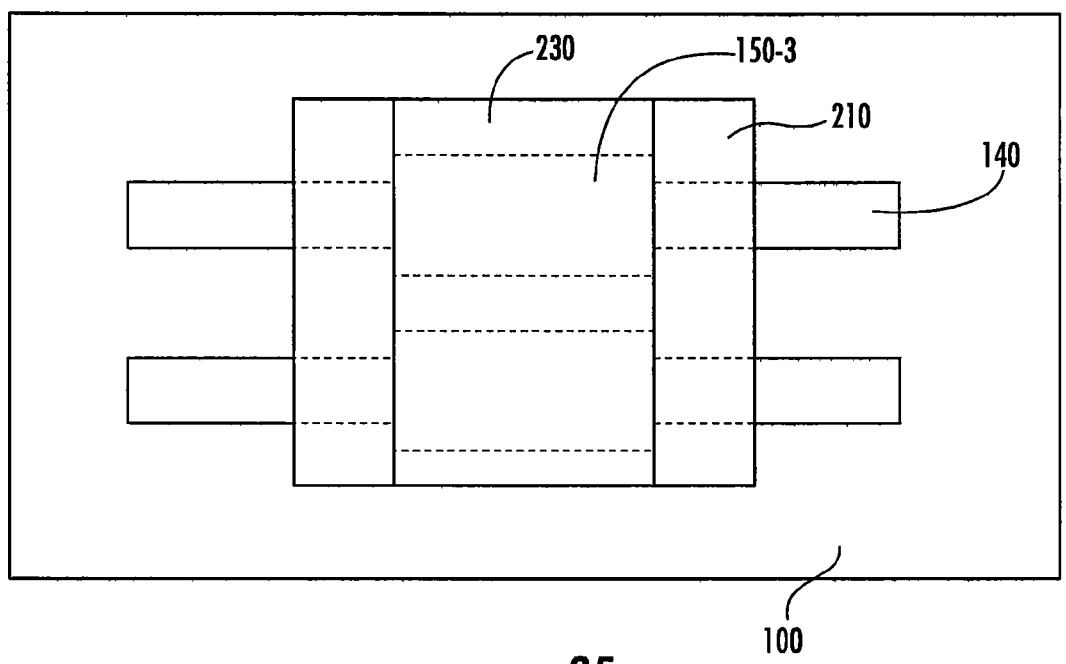

Referring to FIG. 23, the dummy gate electrode 230 may be removed. An epitaxial growth process may be performed using the channel layers 140 as a seed layer to form channel regions 150-3 as illustrated in FIG. 24. Referring to FIG. 25, the dummy gate electrode 230 may be formed again between the gate spacers 210 and then the channel protecting layers 260 may be removed.

Figure 26:
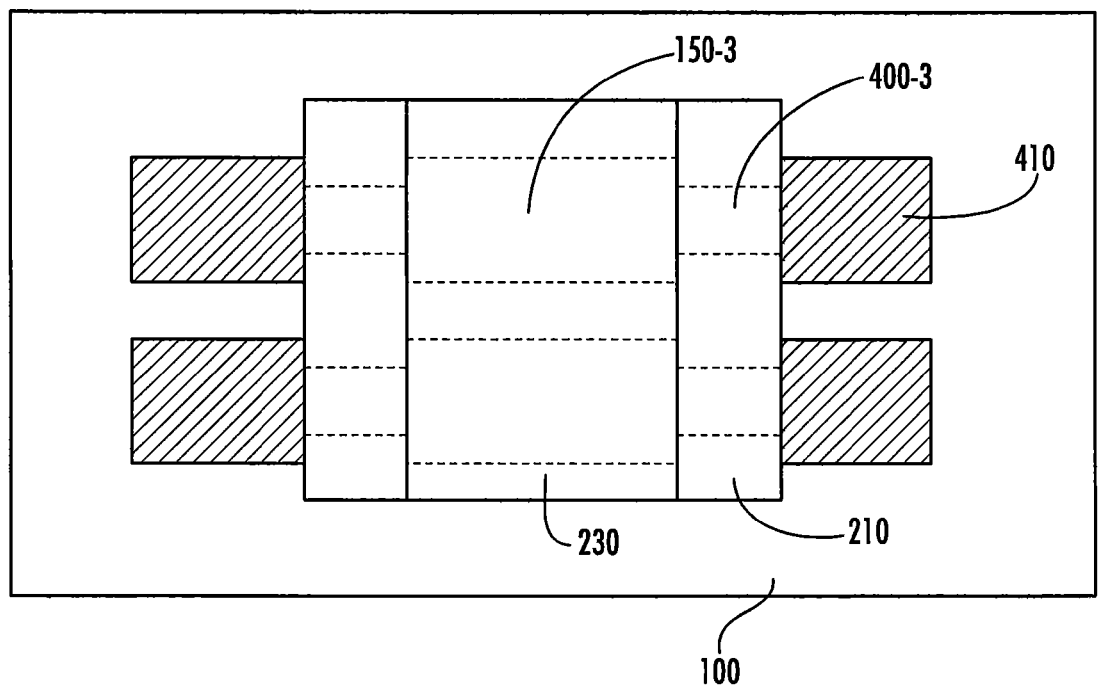

Referring to FIG. 26, the portions of the channel layers 140 exposed by the dummy gate electrode 230 and the gate spacers 210 may be etched and then the source/drain regions 410 may be formed. The source/drain regions 410 may include first impurities having a first conductivity type. A process (e.g., an anneal process) may be performed to form source/drain extension regions 400-3. The first impurities in the source/drain regions 410 may diffuse into the channel layers 140 by the process (e.g., anneal process) to form the source/drain extension regions 400-3. In some embodiments, an ion implantation process and/or a plasma doping process may be performed to include first impurities having the first conductivity type in side portions of the channel layers 140 to form the source/drain extension regions 400-3 before forming the source/drain regions 410.

Referring again to FIGS. 4A and 4B, the dummy gate electrode 230 may be removed and then a gate insulating layer 310 may be formed on sides and upper surfaces of the channel regions 150-3, and a gate electrode 330 may be formed on the gate insulating layer 310.

Figure 27:
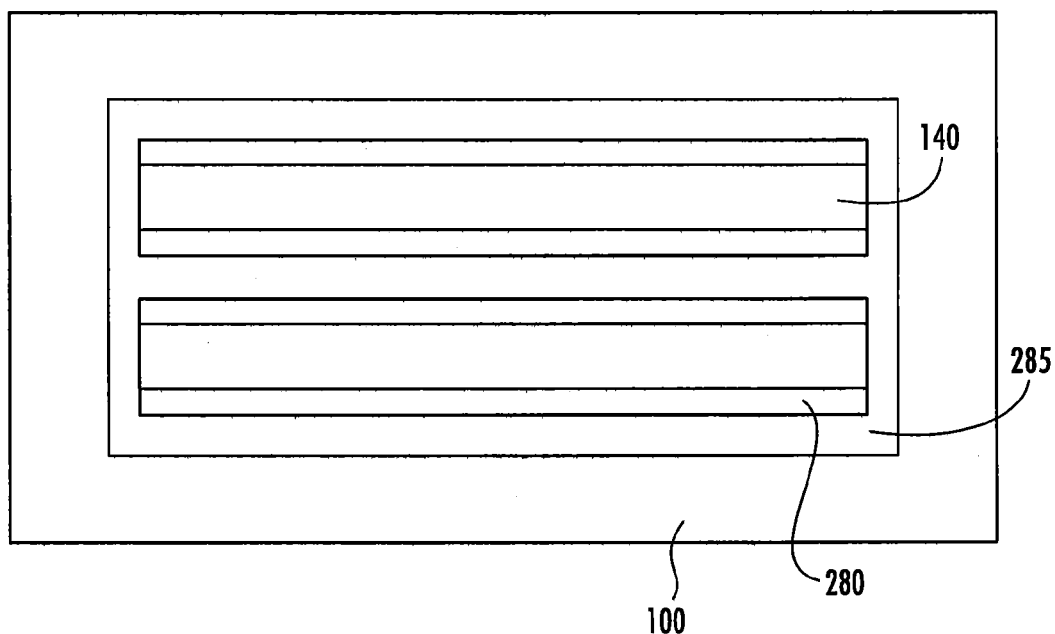
FIGS. 27, 28, 29A and 30 through 34 are plan views
Figure 28:
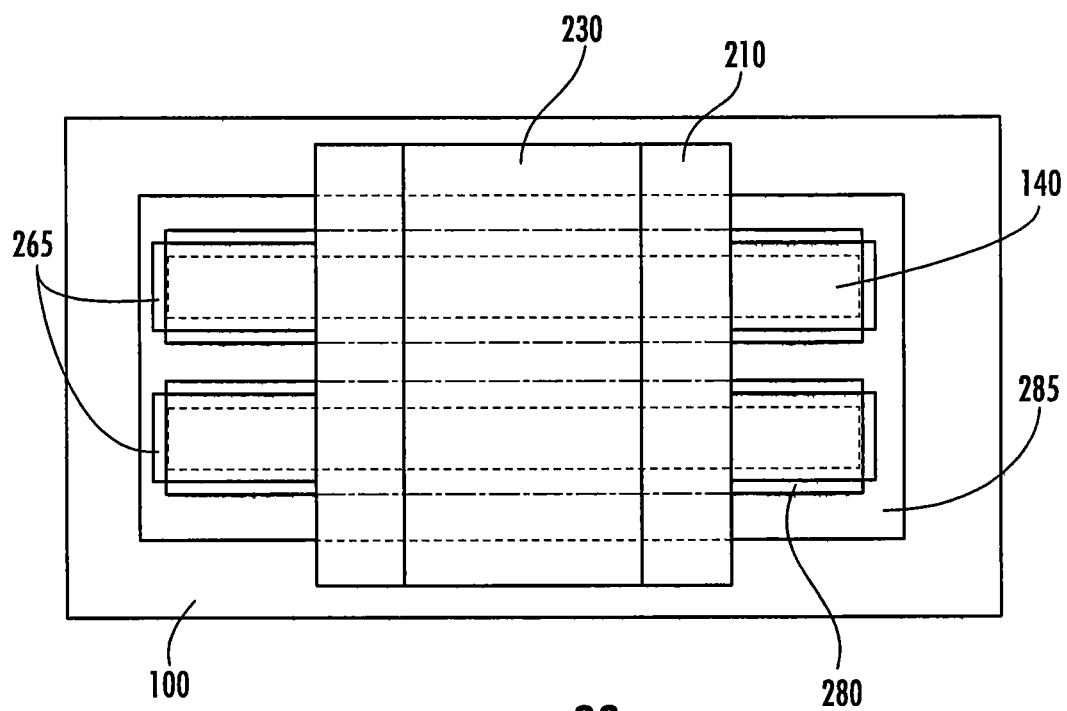
Figure 29A:
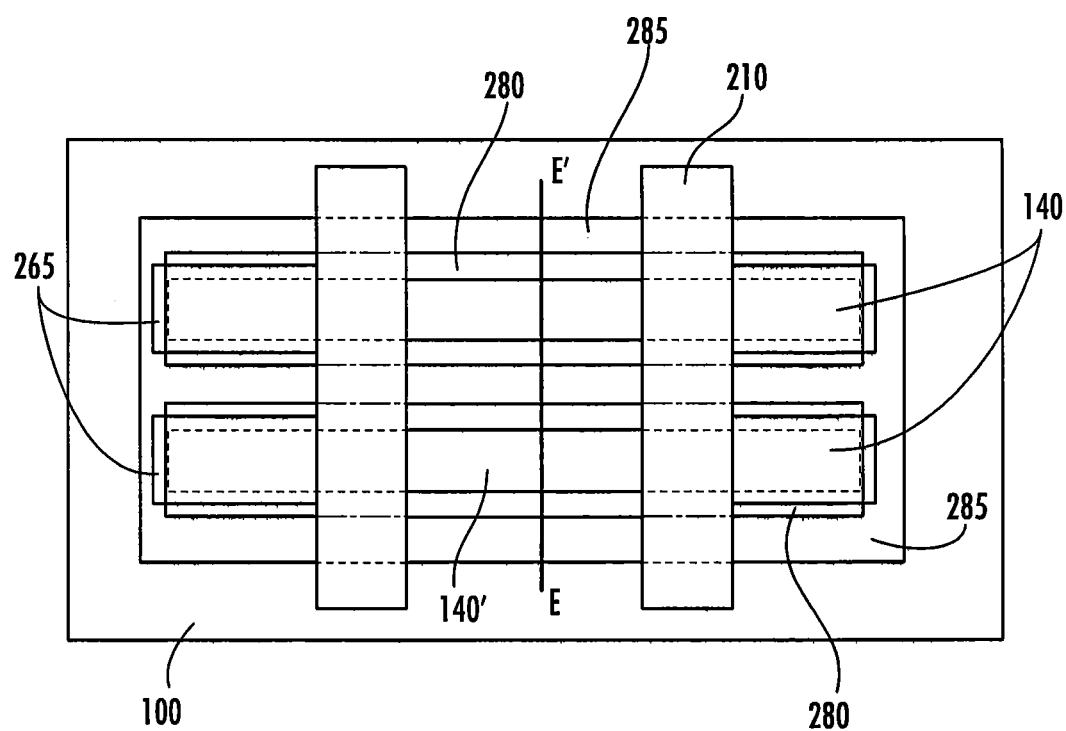

FIGS. 27, 28, 29A and 30 through 34 are plan views and FIG. 29 is a cross-sectional view, taken along the line E-E' of FIG. 29A, illustrating intermediate structures provided as portions of a method of forming an integrated circuit device according to some embodiments of the present inventive concepts. Referring to FIG. 27, channel layers 140 may be formed on the substrate 100. The channel layers 140 may have a line shape that extends in the X direction. Fin spacers 280 may be formed on sides of the channel layers 140 and a fin barrier 285 may be formed on the fin spacers 280. The fin barrier 285 may fill a space between the channel layers 140.

Referring to FIG. 28, a dummy gate electrode 230 may be formed on the channel layers 140, the fin spacers 280 and the fin barrier 285. Gate spacers 210 may be formed on sides of the dummy gate electrode 230. The dummy gate electrode 230 may have a line shape extending in the Y direction and may cress the channel layers 140. Channel protecting layers 265 may be formed on portions of the channel layers 140 exposed by the dummy gate electrode 230 and the gate spacers 210. In some embodiments, the channel protecting layers 265 may include silicon oxide and may have a substantially uniform thickness along sides and an upper surface of the channel layers 140.

Figure 29B:
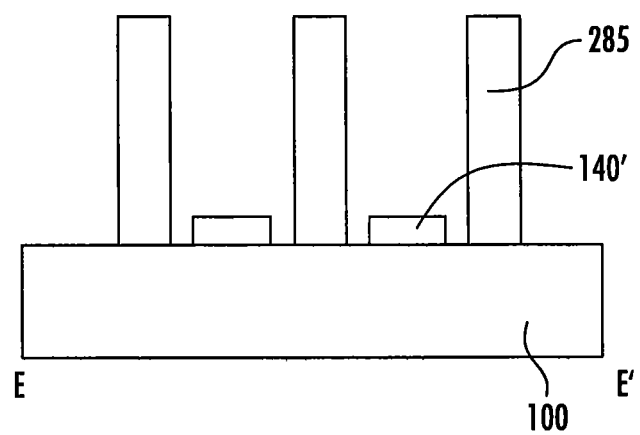
FIG. 29B is a cross-sectional view, taken along the line E-E' of FIG. 29A, illustrating intermediate structures provided as portions of a method of forming an integrated circuit device according to some embodiments of the present inventive concepts.

Referring to FIGS. 29A and 29B, the dummy gate electrode 230 may be removed, and upper portions of the channel layers 140 may be removed to leave portions of the channel layers 140'. The fin spacers 280 may be removed such that spaces defined by the fin barrier 285 may be formed as illustrated in FIG. 29B.

Figure 30:
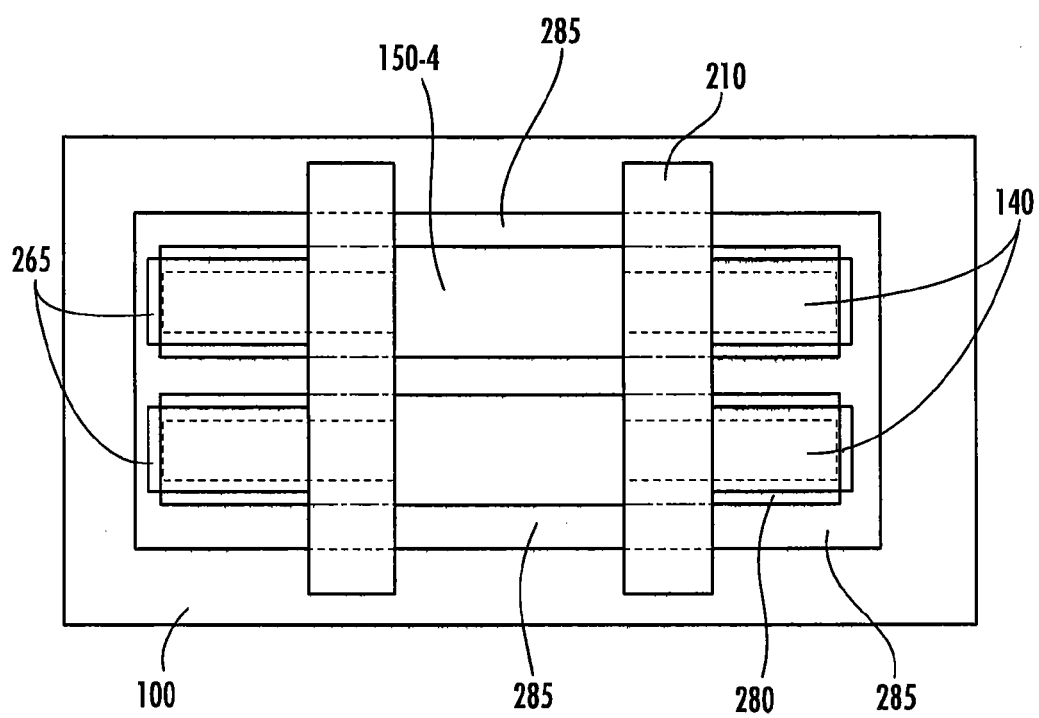
Figure 31:
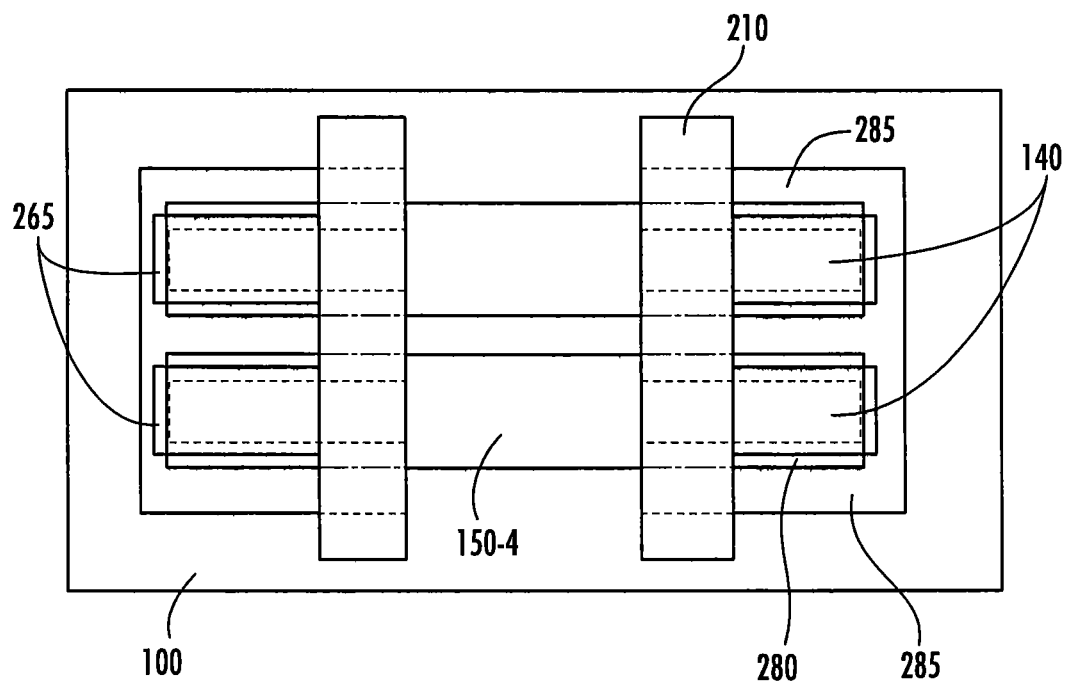

Referring to FIG. 30, an epitaxial growth process may be performed using the portions of the channel layer 140' as a seed layer to form channel regions 150-4. In some embodiments, the channel regions 150-4 may fill the spaces defined by the fin barrier 285. Referring to FIG. 31, the fin barrier 285 between the gate spacers 210 may be removed to expose sides of the channel regions 150-4.

Figure 32:
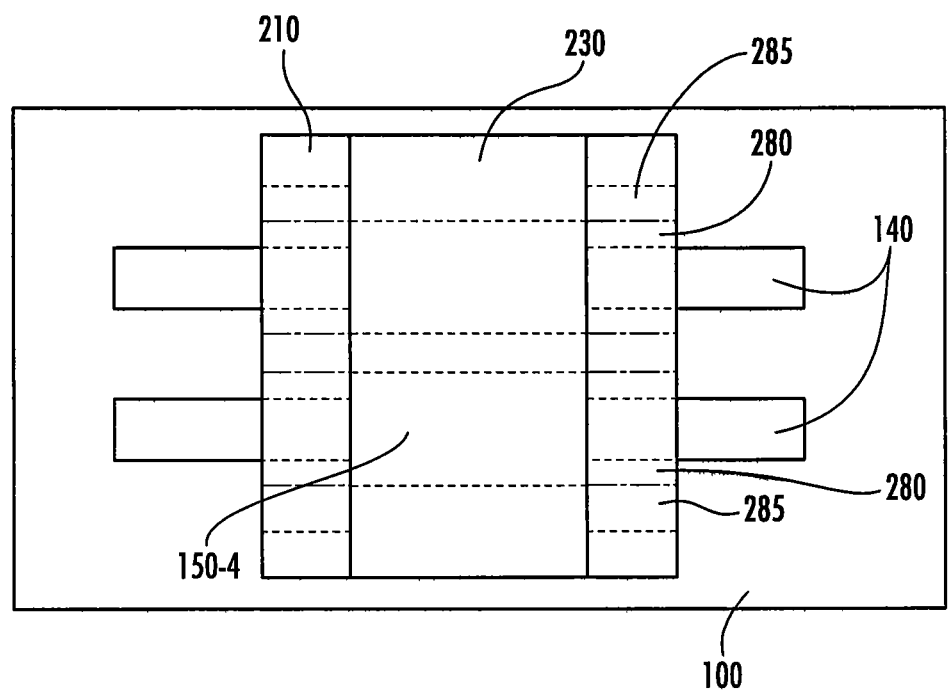
Figure 33:
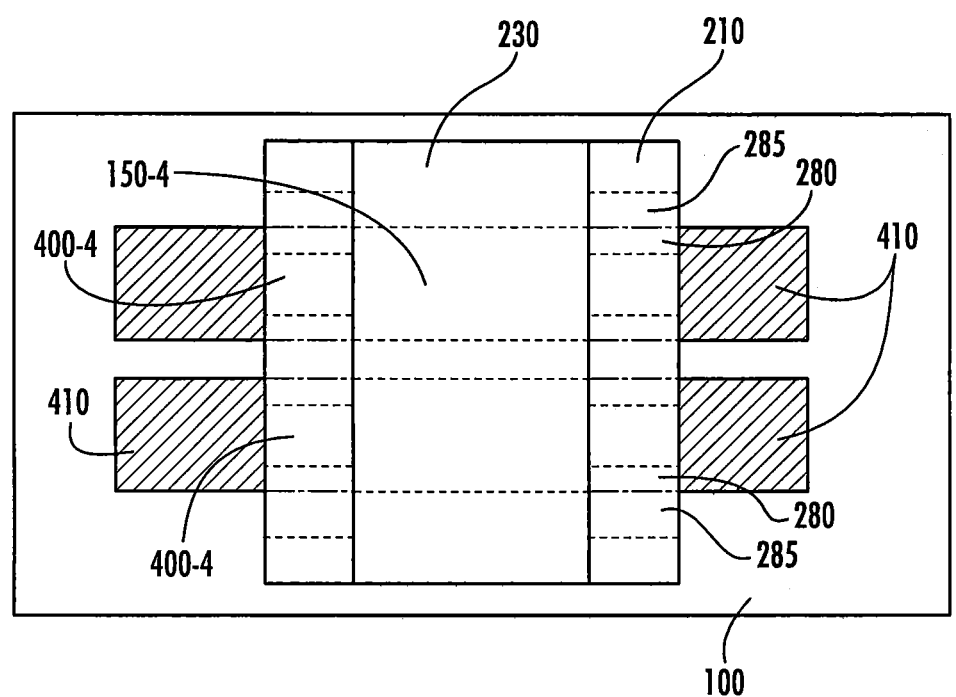

Referring to FIG. 32, the dummy gate electrode 230 may be formed again between the gate spacers 210, and the fin spacers 280 and the fin barrier 285 that are exposed by the dummy gate electrode 230 and the gate spacers 210 may be removed. Referring to FIG. 33, portions of the channel regions 140 exposed by the dummy gate electrode 230 and the gate spacers 210 may be removed and then source/drain regions 410 may be formed by performing, for example, an epitaxial growth process using portions of the channel regions 140 under the gate spacers 210 as a seed layer. The source/drain regions 410 may include first impurities having a first conductivity type. A process (e.g., an anneal process) may be performed to farm source/drain extension regions 400-4. The first impurities in the source/drain regions 410 may diffuse into the channel layers 140 by the process (e.g., anneal process) to form the source/drain extension regions 400-4. In some embodiments, an ion implantation process and/or a plasma doping process may be performed to include first impurities having the first conductivity type in side portions of the channel layers 140 to form source/drain extension regions 400-4 before forming the source/drain regions 410.

Figure 34:
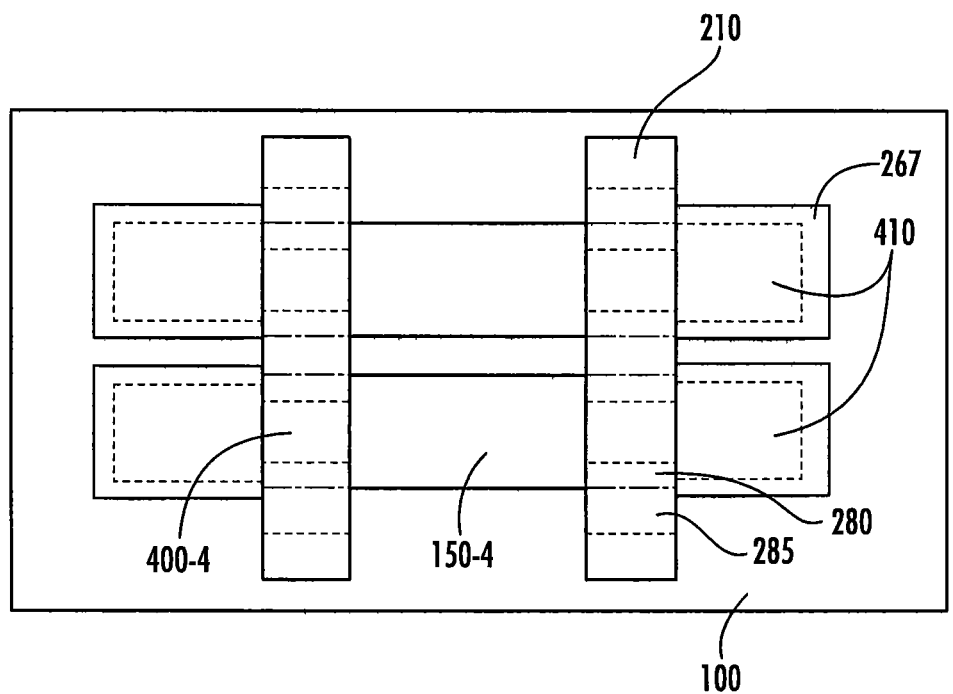

Referring to FIG. 34, source/drain protecting layers 267 may be formed on the source/drain regions 410, and the dummy gate electrode 230 may be removed. Referring again to FIG. 5, a gate insulating layer 310 may be formed on sides and upper surfaces of the channel regions 150-4, and a gate electrode 330 may be formed on the gate insulating layer 310. The source/drain protecting layers 267 may be removed after the gate insulating layer 310 and the gate electrode 330 are formed.

Figure 35:
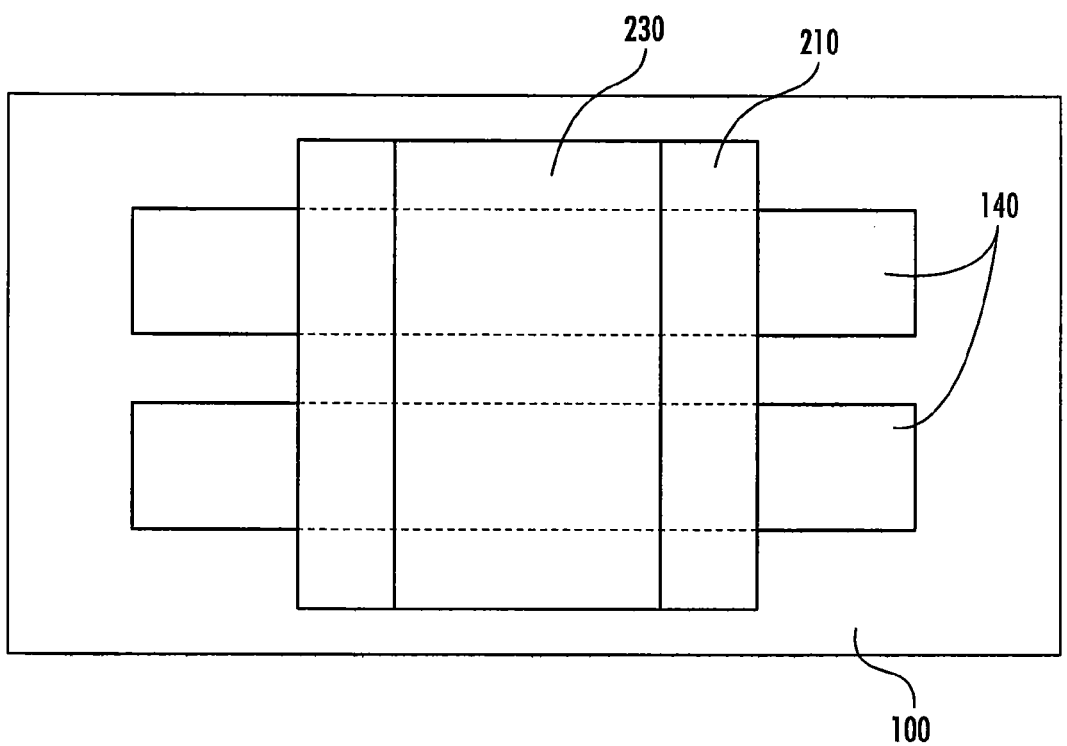
FIGS. 35, 36, 37A, 38 and 39 are plan views
Figure 36:
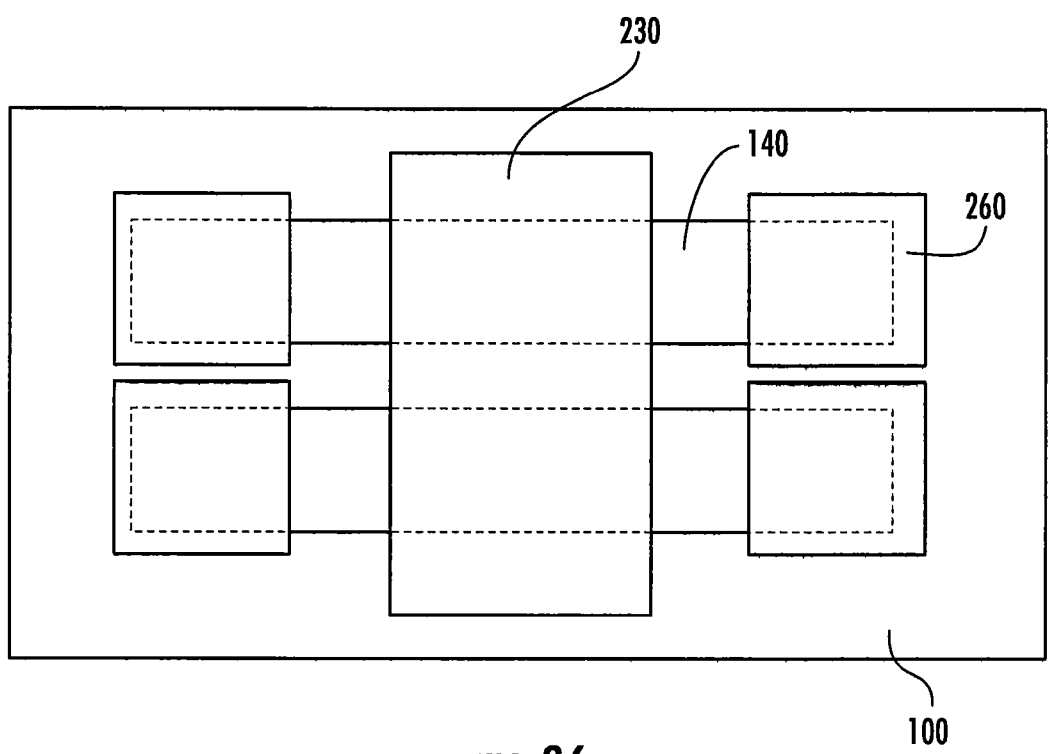
Figure 37A:
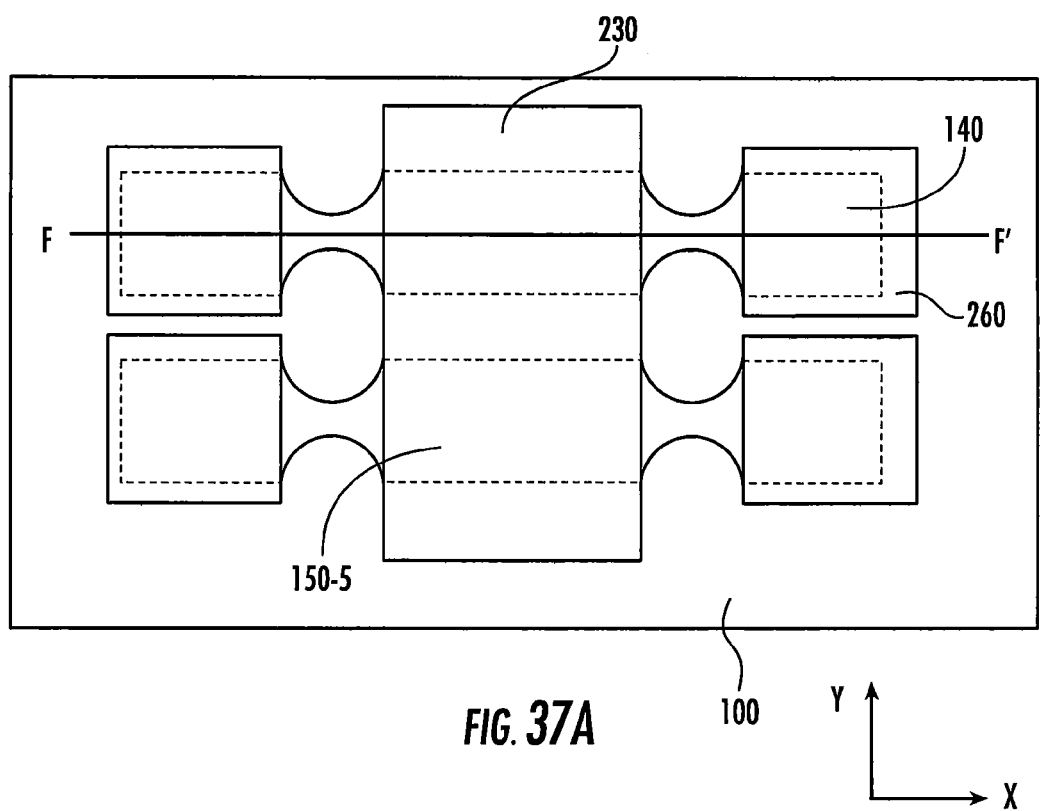
Figure 37B:
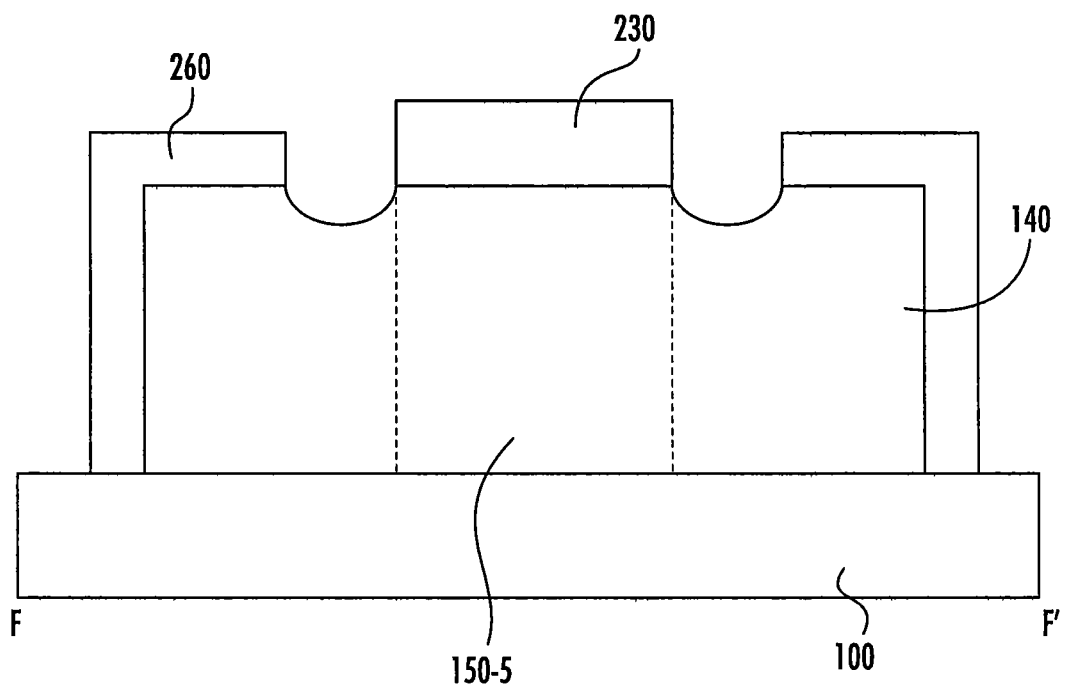
FIG. 37B is a cross-sectional view, taken along the line F-F' of FIG. 37A, illustrating intermediate structures provided as portions of a method of forming an integrated circuit device according to some embodiments of the present inventive concepts.

FIGS. 35, 36, 37A, 38 and 39 are plan views and FIG. 37B is a cross-sectional view, taken along the line F-F' of FIG. 37A, illustrating intermediate structures provided as portions of a method of forming an integrated circuit device according to some embodiments of the present inventive concepts. Referring to FIG. 35, channel layers 140 may be formed on the substrate 100. The channel layers 140 may have a line shape that extends in the X direction. A dummy gate electrode 230 may be formed on the channel layers 140, and gate spacers 210 may be formed on sides of the dummy gate electrode 230. The dummy gate electrode 230 may have a line shape extending in the Y direction and may cross the channel layers 140.

Referring to FIG. 36, channel protecting layers 260 may be formed on portions of the channel layers 140 that are exposed by the dummy gate electrode 230 and the gate spacers 210. In some embodiments, the channel protecting layers 260 may include silicon oxide and may have a substantially uniform thickness along sides and an upper surface of the channel layers 140. The gate spacers 210 may be removed after forming the channel protecting layers 260 to expose the underlying channel layers 140.

Referring to FIGS. 37A and 37B, an etch process may be performed to partially etch the channel layers 140 to form channel regions 150-5. Sides of the channel layers 140 may be etched, and the channel layers 140 may have a varying width in the Y direction along the X direction as illustrated in FIG. 37A. The width of the channel layers 140 in the Y direction may decrease and then increase in the first direction. Upper surface of the channel layers 140 may be etched and may have recesses as illustrated in FIG. 37B. In some embodiments, the etch process may have some orientation dependence such that the sides of the channel layers 140 may be etched faster than the upper surface of the channel layers 140. For example, the upper surface of the channel layers 140 may be in (100) crystal planes, the sides of the channel layers 140 may be in (011) crystal planes, and the etch process may have a faster etch rate in the [110] direction than the [100] direction.

Figure 38:
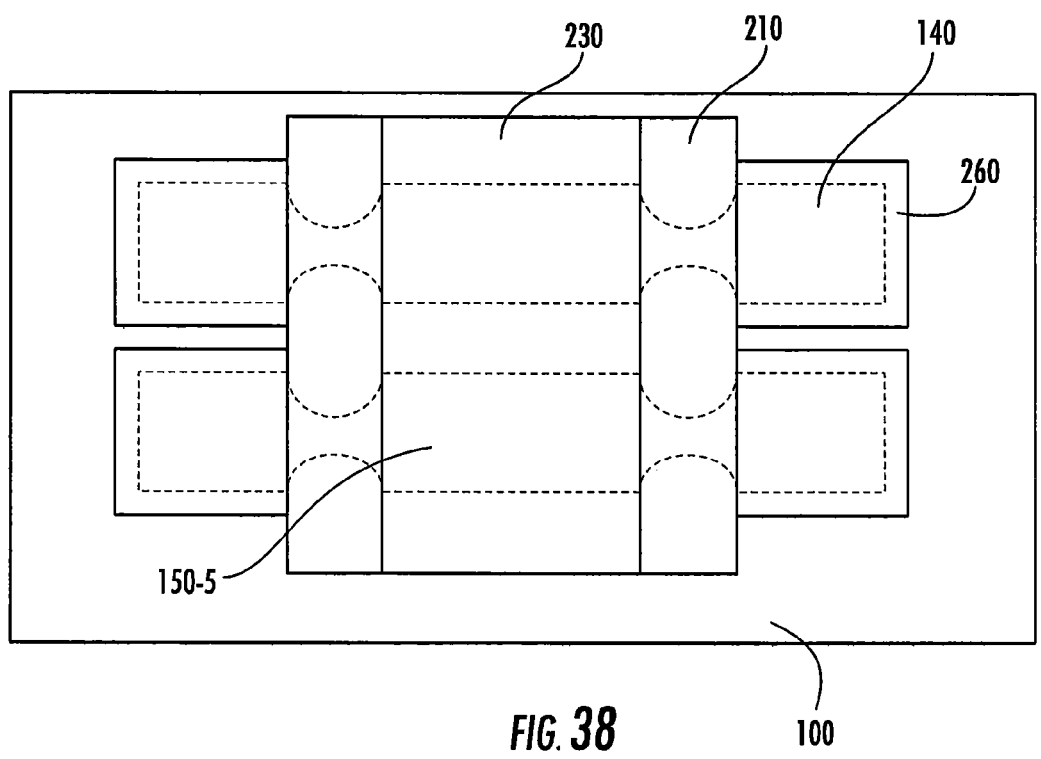
Figure 39:
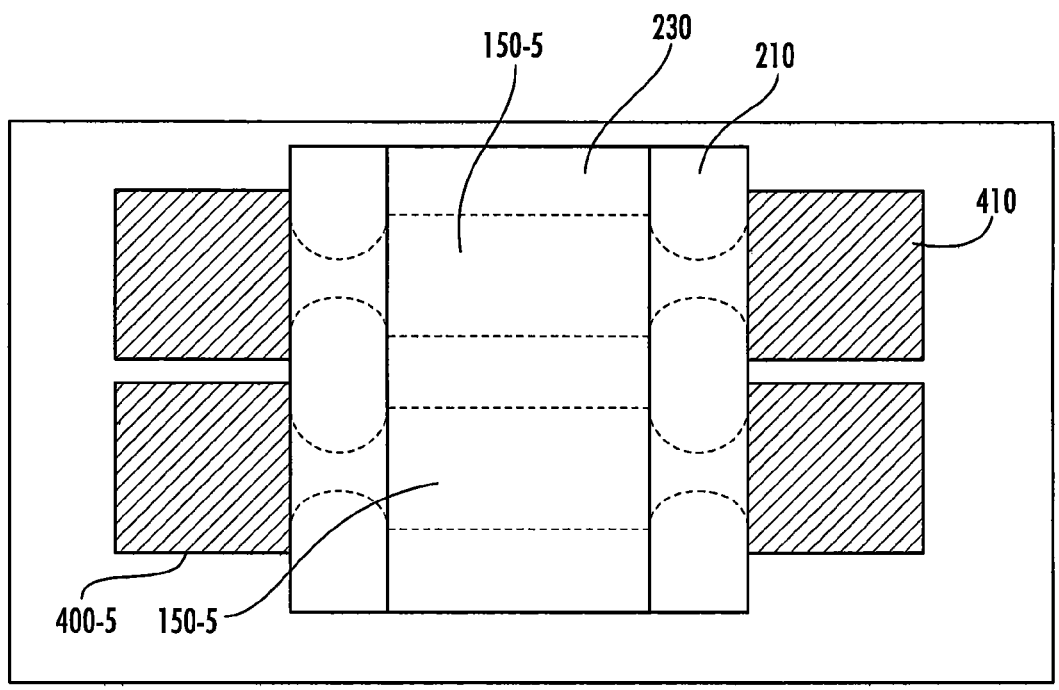

Referring to FIG. 38, the gate spacers 210 may be formed again on the sides of the dummy gate electrode 230. According to FIG. 39, the channel protecting layers 260 may be removed to expose the channel layers 140 underlying the channel protecting layers 260. The exposed channel layers 140 may be etched and then source/drain regions 410 may be formed by performing, for example, an epitaxial growth process using portions of the channel regions 140 under the gate spacers 210 as a seed layer. The source/drain regions 410 may include first impurities having a first conductivity type. A process (e.g., an anneal process) may be performed to form source/drain extension regions 400-5. The first impurities in the source/drain regions 410 may diffuse into the channel layers 140 by the process (e.g., anneal process) to form the source/drain extension regions 400-5. In some embodiments, an ion implantation process and/or a plasma doping process may be performed to include first impurities having the first conductivity type in side portions of the channel layers 140 to form source/drain extension regions 400-5 before forming the source/drain regions 410.

Referring again to FIG. 6, the dummy gate electrode 230 may be removed, and a gate insulating layer 310 may be formed on sides and upper surfaces of the channel regions 150-5. A gate electrode 330 may be formed on the gate insulating layer 310.

The above-disclosed subject matter is to be considered illustrative, and not restrictive, and the appended claims are intended to cover all such modifications, enhancements, and other embodiments, which fall within the true spirit and scope of the inventive concepts. Thus, to the maximum extent allowed by law, the scope is to be determined by the broadest permissible interpretation of the following claims and their equivalents, and shall not be restricted or limited by the foregoing detailed description.

What is claimed:

1. An integrated circuit device comprising:
   a stack on a substrate, the stack comprising a plurality of channel regions and a plurality of gate electrodes stacked in an alternating sequence in a vertical direction that is perpendicular to a surface of the substrate and the plurality of channel regions comprising impurities having a first conductivity type;
   source/drain regions on respective opposing sides of the stack, the source/drain regions being spaced apart from each other in a horizontal direction that is parallel to the surface of the substrate and comprising impurities having a second conductivity type that is different from the first conductivity type; and
   a plurality of extension regions between respective ones of the plurality of channel regions and one of the source/drain regions and comprising impurities having the second conductivity type, each of the plurality of extension regions having a thickness in the vertical direction that is less than those of the plurality of channel regions and the one of the source/drain regions,
   wherein each of the plurality of channel regions overlaps with the plurality of gate electrodes in plan view, and the thickness of the plurality of channel regions in the vertical direction is uniform.

2. The device of claim 1, wherein a width of the plurality of gate electrodes in the horizontal direction is less than a width of the plurality of channel regions in the horizontal direction.

3. The device of claim 1, wherein the thickness of each of the plurality of extension regions decreases in the horizontal direction toward the one of the source/drain regions.

4. The device of claim 1, wherein the thickness of each of the plurality of extension regions decreases and then increases in the horizontal direction toward the one of the source/drain regions.

5. The device of claim 1, wherein the plurality of gate electrodes are spaced apart from the one of the source/drain regions, and
   wherein the device further comprises a plurality of insulation layers between respective ones of the plurality of gate electrodes and the one of the source/drain regions, and the plurality of insulation layers has a dielectric constant lower than silicon oxide.

6. The device of claim 1, wherein an impurity concentration of the source/drain regions is greater than an impurity concentration of the plurality of extension regions.

7. The device of claim 1, wherein the source/drain regions and the plurality of extension regions comprise a same material and composition.

8. An integrated circuit device comprising:
   a channel region on a substrate, the channel region comprising impurities having a first conductivity type;
   a gate electrode on the channel region;
   source/drain regions on respective opposing sides of the channel region, the source/drain regions being spaced apart from each other in a first direction and comprising impurities having a second conductivity type that is different from the first conductivity type; and
   an extension region between the channel region and one of the source/drain regions, the extension region comprising impurities having the second conductivity type and having a cross-sectional area perpendicular to the first direction that is less than those of the channel region and the one of the source/drain regions,
   wherein the cross-sectional area of the extension region decreases along the first direction toward the one of the source/drain regions.

9. The device of claim 8, wherein the channel region overlaps with the gate electrode in plan view, and the cross-sectional area of the channel region perpendicular to the first direction is uniform.

10. The device of claim 8, wherein an impurity concentration of the source/drain regions is greater than an impurity concentration of the extension region.

* * * * *